(12) United States Patent
Arye

(10) Patent No.: US 8,707,137 B2
(45) Date of Patent: Apr. 22, 2014

(54) ADAPTING BIT ERROR RATE TO A TARGET QUALITY OF SERVICE

(75) Inventor: Ram Arye, Rishon-le-Zion (IL)

(73) Assignee: Celtro Ltd. Company, Petach Tikva (IL)

( * ) Notice: Subject to any disclaimer, the term of this patent is extended or adjusted under 35 U.S.C. 154(b) by 619 days.

(21) Appl. No.: 12/854,404

(22) Filed: Aug. 11, 2010

(65) Prior Publication Data

US 2011/0066915 A1 Mar. 17, 2011

Related U.S. Application Data

(60) Provisional application No. 61/242,334, filed on Sep. 14, 2009.

(51) Int. Cl.
*G06F 11/00* (2006.01)
(52) U.S. Cl.
USPC .......................................... 714/774; 714/704
(58) Field of Classification Search
USPC .................................................. 714/704, 774
See application file for complete search history.

(56) References Cited

U.S. PATENT DOCUMENTS

| | | | |
|---|---|---|---|
| 7,046,930 B2 * | 5/2006 | Kawarai | 398/27 |
| 7,146,185 B2 | 12/2006 | Lane | |
| 7,149,424 B2 * | 12/2006 | Kamalov et al. | 398/27 |
| 7,634,194 B2 * | 12/2009 | Frankel et al. | 398/5 |
| 8,089,892 B2 * | 1/2012 | Liu et al. | 370/252 |
| 8,244,127 B2 * | 8/2012 | Sadananda et al. | 398/29 |
| 2003/0161323 A1 | 8/2003 | Harada et al. | |
| 2004/0022267 A1 | 2/2004 | Birru | |
| 2004/0076430 A1 * | 4/2004 | Zaacks et al. | 398/27 |
| 2005/0007993 A1 | 1/2005 | Chambers et al. | |
| 2006/0128318 A1 | 6/2006 | Agarossi et al. | |
| 2007/0189235 A1 | 8/2007 | Chandra et al. | |
| 2007/0249391 A1 | 10/2007 | Van Rooyen | |
| 2008/0242339 A1 | 10/2008 | Anderson | |
| 2009/0131101 A1 | 5/2009 | Van Rooyen | |
| 2011/0199994 A1 * | 8/2011 | Kim et al. | 370/329 |

FOREIGN PATENT DOCUMENTS

EP 1345348 A1 9/2003

* cited by examiner

*Primary Examiner* — Bryce Bonzo
*Assistant Examiner* — Elmira Mehrmanesh
(74) *Attorney, Agent, or Firm* — Smith Risley Tempel Santos LLC; Gregory Scott Smith

(57) ABSTRACT

Communication frames transmitted over a communication network may have different QoS requirements for each communication session. The required BER for different types of communication session is selected based at least in part on the required QoS for that communication session. When frames are received, the QoS level associated with the frame is determined. Based at least in part on the QoS level, the frames are routed toward the destination over a path that provides BER protection commensurate with the required QoS. Prior to transmission to the destination, the processed frames are multiplexed together into a single stream of segment. On the receiving side, the stream of segments is divided in accordance with the QoS level associated with the segments and the segments are routed over a path that is selected, at least in part, on the QoS level. Over this selected path, the original frames are restored and then provided to the destination node.

26 Claims, 12 Drawing Sheets

ADAPTING BIT ERROR RATE TO A TARGET QUALITY OF SERVICE

CROSS-REFERENCE TO RELATED APPLICATIONS

This application is being filed under 35 USC 111 and 37 CFR 1.53(b) and claims the benefit of the filing date of the U.S. Provisional Application for Patent that was filed on Sep. 14, 2009, bearing the title of "METHOD AND SYSTEM FOR ADAPTIVE BIT ERROR RATE TO A SESSION ACCORDING TO ITS REQUIRED QUALITY OF SERVICE" and assigned Ser. No. 61/242,334, which application is hereby incorporated by reference in its entirety.

BACKGROUND

The embodiments presented in this disclosure generally relate to communication networks, and more particularly, to communication over a communication link that carries a plurality of different communication sessions having different quality of service requirements.

The rapid evolution of communication networks has resulted in the development of communication nodes that are able to transfer different types of communication sessions through a communication link. Known techniques offer different bit error rate (BER) protection according to the signal to noise ratio (SNR) detected on the communication link. Exemplary BER protection techniques can include: changing the modulation rate, adapting the transmitting power, automating retransmitting request, adding or removing forward error correction (FEC) bits, etc.

Differing types of communication sessions may have a requirement, or a preference for different quality of service (QoS) of the communication session. Some communication sessions, for example one that provides real time audio communications, require and/or are entitled to a high quality of service (QoS). Other exemplary communication sessions can have medium QoS requirements. Audio and video sessions over IP are non-limiting examples of a communication session that has medium QoS requirements. Yet other exemplary communication sessions can have low QoS requirements. A few non-limiting examples of a communications session that have low QoS requirements, include best effort QoS, emails, internet surfing, content downloading, etc.

There are different known techniques that operate to handle a data communication session in accordance with its target or required QoS. A few non-limiting examples of such techniques include: multi-protocol label switching (MPLS), generalized MPLS (GMPLS), Asynchronous Transfer Mode (ATM), etc. Each of these techniques, as well as others, are aware of the QoS required by the communication sessions and are configured to navigate the communication sessions to the appropriate communication path accordingly.

It should be appreciated by those skilled in the art that the above-mentioned techniques for ensuring a BER, which modify the communication sessions in-order to protect the BER over a communication link, do not take into account the different QoS of the different communication session that pass through the same link. For example, one communication session may require a high QoS while another communication session that needs to be transferred via the same nodes and same communication link may require a best effort QoS. In this scenario, both sessions are handled by a common protection method regardless of the QoS required. More specifically, if the measured SNR through the communication link is high, then the BER assurance technique will modify the bit rate or modulation of the communication sessions such that the BER will improve or at least will not be decrease. Another exemplary option is to modify the communication session's forward error correction (FEC) or other error correction technique, to meet the BER/MER (message error rate) requirements.

Again, the modulation and/or FEC will be executed over all the communication sessions that pass through the communication link regardless of the targeted QoS for a particular communication session.

SUMMARY OF THE DESCRIPTION

Common BER assurance techniques may be applied to protect even a communication session that has a low QoS requirement. A communication session with low a QoS requirement will still be modified by the addition of redundant bits being added as FEC, thereby causing more BW consumption and increasing the load over the link. All of this is performed even though it may not be required by the particular level of QoS. In an alternate situation, the rate of the modulation may be decreased due to the SNR, thereby slowing the communication for no reason, or at least not based on any particular requirements.

The above-described deficiencies in data transmission and control do not limit the scope of the inventive concepts of the present disclosure in any manner. The deficiencies are presented for illustration only.

Embodiments of the present disclosure provide novel systems and methods that enable the protection of a plurality of different communication sessions by providing BER protection according to the target or required QoS for each communication session. There is a further need in the art for providing BER individually on the same communication link simultaneously.

Exemplary embodiments of the BER controller and systems and methods based on such BER controller, presented throughout the disclosure provide a novel system and method that maintains the required BER of a plurality of different types of communication session in accordance with the required QoS for each communication session. Furthermore, embodiments provide this functionality to communication sessions on an individual basis, even when such communication sessions exist over the same communication link simultaneously.

In an exemplary embodiment of a system incorporating the BER controller, an embodiment of the BER controller can be associated with each end of a communication link existing between two intermediates nodes. The physical layer of an exemplary communication link can be a microwave link, such as but not limited to: plesiochronous digital hierarchy (PDH), synchronous digital hierarchy (SDH), and Worldwide Interoperability for Microwave Access (WiMax). Non-limiting examples of the intermediate nodes that can exist in such configurations include, but are not limited to: a base station, node B (Nb), Radio Network Controller (RNC), etc. One exemplary embodiment can comprise an intermediate-adaptive-protection transmitter (IAPT) and an intermediate-adaptive-protection receiver (IAPR). The IAPT can be associated with a transmitting node, and the IAPR can be associated with a receiving node. As a non-limiting example of the operation of such an embodiment, the exemplary IAPT can receive, from the transmitting node, a plurality of different communication sessions to be transferred through a communication link toward a receiving node via the IAPR. Each of the communication sessions passed through the link between IAPT and IAPR can have a different required quality of service (QoS). For example, one session (S1) can have a best effort QoS requirement, another session (S2) can have a medium QoS requirement, and a third session (S3) can have a high QoS requirement. Further, some exemplary embodiments of the present disclosure may refer to the number of bytes carried by a certain data packet as an indication of the QoS. A packet carrying a large number of bytes, 1000 to 1500 bytes for example, can be handled as a packet that has a high QoS independent of its QoS label, for example. The motivation for providing a high BER protection technique to a large packet is to reduce the number of retransmission requests that may be sent from the destination of such a large packet.

In another exemplary embodiment of a system or method employing the BER controller, two combined-intermediate adaptive-protection devices (CIAPD) can be used, one CIAPD in each side of the communication link. Each CIAPD can include elements of an IAPT and elements of an IAPR. In yet another embodiment, an exemplary IAPT and/or IAPR can be embedded within an intermediate node.

Common data traffic over a communication link can be carried over a network and typically, includes an embedded QoS indication. For example, within an ATM network, the headers of the transmitted data from an ATM cell include an indication of the required QoS. Within a GMPLS network or an MPLS network, the data is transmitted as packets over in tunnels over IP. Each GMPLS/MPLS packet has an encapsulated header, referred as a label, which includes data that identifies the required QoS.

Usually, data traffic sessions are carried over a data link in data units. Exemplary data units can be Ethernet frames, IP packets, ATM cells, etc. The term frame can be used as representative term for any of the above group of data units. In an exemplary embodiment, the frames of a communication session received at the input of an IAPT can be parsed to determine their required QoS. For example, a layer 2 header, the data link layer of an Open System Interconnection (OSI), can be parsed. In another embodiment, the parsing can be limited to the encapsulation header having the QoS label. If the communication sessions are carried over GMPLS, MPLS, or ATM, the header/label with information regarding the required QoS can be found, for example. In other embodiments the parsing can continue up within a higher OSI layer, if needed. The different frames of the communication sessions are then separated by the IAPT, according to their required QoS, and handled differently. More details regarding the process are provided below.

An exemplary embodiment can also measure the current signal to noise ratio (SNR) over the link using feedback received from the IAPR, for example. In an alternate embodiment the information regarding the SNR over the communication link can be received from a line decoder such as, but not limited to, a PVG310 made by Provigent Israel, for example.

Each received frame is intercepted and processed by the IAPT in order to adapt its BER protection in accordance with the required QoS of the applicable communication session. For instance, the BER technique employed on the received frame may be selected, based at least in part on the QoS level associated with that frame, or the communication session for which that frame is transmitted. In some embodiments, the BER protection is also selected and/or adapted in view of the current SNR over the connection. The BER protection scheme or technique selected and utilized can include changing the modulation of the session, and/or adding/reducing FEC bytes, and so on. Changing the modulation can include adapting the order of phase-shift keying (PSK) modulation according to the required QoS. The PSK order can be Quadrature phase-shift keying (QPSK), 8-PSK, 16-PSK, etc. Other types of modulation can include Quadrature amplitude modulation (QAM), for example. Yet, in other embodiments, the modulation can be modulating the transmission power of a frame. A frame that requires higher QoS can be transmitted using high microwave power while a frame with a low QoS can be transmitted with low microwave power, etc. Data frames of each communication session can be modified differently from the other communication sessions being serviced on the same link. The adapted-protected data can then be transmitted toward the second intermediate node via the communication link and via the IAPR.

At the other end of the communication link, the IAPR receives the adapted-protected data; decodes the adapted-protected data of each session in accordance with the modulation and the FEC protection level for that communication session that was employed in the transmitting side; and transfers the decoded data toward the second intermediate node. The protection level status and control can be transferred between the IAPT and the IAPR in-band as an auxiliary header or out of band. In embodiments in which the transmission power is modulated according to the required QoS, there is no need for an IAPR on the other end of the connection. Consequently, data frames of different sessions will get different BER protection in compliance with the QoS that each session is entitle to receive.

The foregoing summary is not intended to summarize each potential embodiment or every aspect of the present invention, and other features and advantages of the present invention will become apparent upon reading the following detailed description of the embodiments with the accompanying drawings and appended claims.

Furthermore, although specific exemplary embodiments are described in detail to illustrate the inventive concepts to a person skilled in the art, such embodiments can be modified to various modifications and alternative forms. Accordingly, the figures and written description are not intended to limit the scope of the inventive concepts in any manner.

BRIEF DESCRIPTION OF THE DRAWINGS

Exemplary embodiments of the present disclosure will be understood and appreciated more fully from the following detailed description, taken in conjunction with the drawings in which.

DETAILED DESCRIPTION OF EXEMPLARY EMBODIMENTS

Turning now to the figures in which like numerals represent like elements throughout the several views, exemplary embodiments of the BER controller, systems and methods employing such embodiments, and features and aspects thereof are presented in greater detail. For convenience, only some elements of the same group may be labeled with numerals. The purpose of the drawings is to describe exemplary embodiments and is not for production purpose. Therefore features shown in the figures were chosen only for convenience and clarity of presentation.

Figure 1:
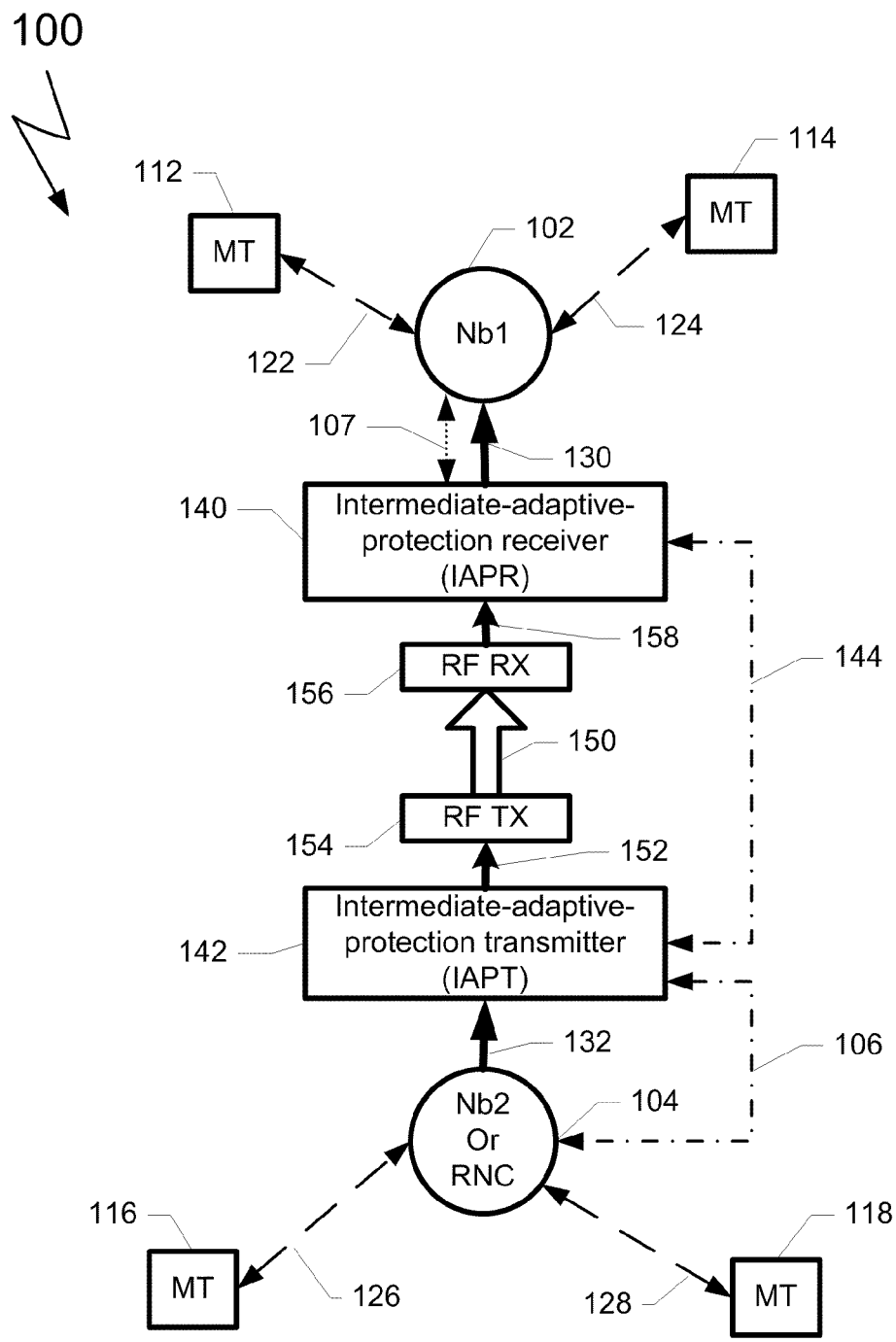
FIG. 1 is a simplified block diagram illustrating an exemplary portion of a communication network in which an exemplary embodiment of the present invention can be used.

FIG. 1 is a simplified block diagram illustrating an exemplary portion of a communication network in which an exemplary embodiment of the BER controller can be used. The illustrated block diagram shows relevant elements of an exemplary communication system 100 that can be a suitable environment for implementing exemplary embodiments of the BER controller. Communication system 100 may include, but is not limited to, a plurality of intermediate nodes, such as but not limited to, a Transmitting Node 104 (Nb2) and a Receiving Node 102 (Nb1). Transmitting Node 104 (Nb2) can be a Radio Network Controller (RNC) of a cellular service provider, for example. Other service providers can also be represented by the transmitting node, such as but not limited to, an Internet service provider (ISP), a public switched telephone network (PSTN) operator, a data network operator, an access network service provider, etc.

Receiving Node 102 (Nb1) can be a Node Base, for example. Receiving Node 102 can be connected to a plurality of Mobile Terminals (MT) 112 and 114 through wireless links 122 and 124, for example. Transmitting Node 104 (Nb2) can be connected to a plurality of Mobile Terminals (MT) 116 and 118 through wireless links 126 and 128, for example. When the Transmitting Node 104 is an RNC, then, in addition to the connections shown in the drawing, the RNC 104 is connected to the cellular operator access network, not shown in the drawings.

In the example of FIG. 1, the Transmitting Node 104 can be associated with an intermediate-adaptive-protection transmitter (IAPT) 142, via communication link 132. Communication link 132 can be implemented in many different forms such as, but not limited to: Twisted pairs links, Fiber Optic links, etc. In another embodiment, IAPT 142 can be embedded in the transmitting node 104 itself. IAPT 142 can also send and receive status, control and feedback information from Transmitting Node 104 via connection 106, for example. Connection 106 can be an in-band channel (existing within communication link 132) or an out-of-band connection.

An exemplary IAPT 142 can receive/intercept, from the transmitting node 104, a stream of a plurality of different communication sessions to be transferred toward the Receiving Node 102 (Nb1). Each communication session can be subject to a different required quality of service (QoS). For example, one session (S1) can have a best effort QoS, another session (S2) can have a medium QoS requirement, and a third session (S3) can have a high QoS requirement.

An exemplary IAPT 142 can parse frames of each session in the stream and determine the QoS required for that session. The layer 2 header can be parsed to determine the required QoS, for example. In other embodiments, in which the data is carried in IP tunnels, such as GMPLS or MPLS, the parsing can be limited to the encapsulation header with the QoS label, for example. If the communication sessions are carried over GMPLS, MPLS, or ATM, the header/label with information regarding the required QoS can be found, for example. In other embodiments, the parsing can be performed at higher OSI layers, if needed. The different sessions are then separated by the IAPT 142, according to their required QoS, into two or more groupings and, the frames of the different sessions are then processed accordingly. For example, as is further described in more detail below, the groupings can be transmitted or propagated over different paths with each path processing the data differently. In other embodiments, the groupings can simply be processed differently, such as selecting a different BER protection technique based at least in part on the QoS level for the particular group and applying such BER protection technique. In such an embodiment, it will be appreciated that different physical paths could be used, as previously mentioned but, those skilled in the art will appreciate that different logical paths may also be used or, the same paths can be used but the groups simply processed differently. With the logical path embodiments, the data associated with the various communications sessions can be held in a common memory and processed in the selected or required manner. More details regarding this process are provided below.

An exemplary embodiment of an IAPT 142 can also take into consideration the SNR of the communication link 150 in which the different communication sessions need to pass through on their way to the receiving node (Nb1). In some embodiments, information regarding the SNR over the communication link can be received from a line decoder, such as but not limited to, a PVG310 made by Provigent Israel, for example. In other embodiments, the SNR can be calculated based on feedback that is received from the other side of the communication link 150.

Yet, an exemplary embodiment of an IAPT 142 may refer to the number of bytes carried by a certain data packet as an indication of the QoS. A packet carrying a large number of bytes, 1000 to 1500 bytes for example, can be handled as a packet that has high a QoS independent of its QoS label, for example. The motivation for providing high a BER protection technique to a large packet is to reduce the number of retransmission requests that may be sent from the destination of such a large packet.

In accordance with the QoS requirements and the information regarding the SNR, each communication session can be processed by the IAPT 142 with a different BER protection. The IAPT 142 can separate the originally received stream of different communication sessions into two or more paths according to the QoS requirements of the communication sessions. In each path, the received frames are segmented into data segments having a predefine number of bytes. In each path a different bit error rate protection method can be implemented on each data segment, changing the segments into to an adapted-protected data segment. The bit error rate protection methods employed can include changing the modulation of the session, or adding/reducing FEC bytes to each segment, for example. Each communication session segment can be modified differently from the other communication session segments passing through the same communication link 150.

Next, the IAPT 142 can transfer the adapted-protected data segments to an RF transmitter 154 (RF TX) via a communication link 152. Communication link 152 can be a wired connection, for example. In some embodiments, the communication link 152 may comply with the same protocols as communication link 132. In an alternate embodiment IAPT 142 can command the RF transmitter 154 to implement part of the bit error rate protection methods on each data segment, such as implementing modulation changes, for example. The adapted-protected data segments can then be transmitted toward the second intermediate node via a communication link 150. Communication link 150 can be a microwave connection, such as an SDH, for example.

An exemplary RF receiver 156 at the other end of the communication link 150, can receive the adapted-protected data segments and convert the adapted-protected data segments from RF to digital data, for example. The RF receiver 156 can transfer the converted-adapted-protected data to an Intermediate-adaptive-protection receiver 140 (IAPR), via connection 158. The connection link 158 can be a wired connection, for example.

In an exemplary embodiment, a status and control connection 144 between IAPR 140 and IAPT 142 can be established. The status and control connection 144 can be an in-band channel or an out-of-band communication connection. The communication over the status and control connection 144 between the IAPR 140 and the IAPT 142 can include control commands, status and feedbacks, etc. The IAPR 140 can also detect and restore lost segments. Information about missing bits and/or errors can be reported from the IAPR 140 over connection 144 to the IAPT 142. The IAPT 142 can use this information for updating the SNR value, for example. Intermediate-adaptive-protection receiver 140 (IAPR) can restore the adapted-protected data segments according to information passed via the status and control connection 144, for example. More information on the operation of the IAPR 140 and the IAPT 142 is disclosed below in conjunction with the description of FIG. 2A*a*, FIG. 2B, FIG. 3A and FIG. 3B. In an exemplary embodiment, an RF receiver 156 at the other end of the communication link 150, can be capable of restoring the adapted-protected data segments received. Such an exemplary RF receiver 156 can be Provigent, for example.

The IAPR 140 can be associated with the receiving node 102. The association can be via a Link 130. The Link 130 can be a wired link, as well as other types of links. In some embodiments, the communication link 130 may comply with the same protocols as communication link 158. The communication sessions data can pass through the Link 130. In another embodiment, the IAPR 140 can be embedded in the receiving node 102 itself. The IAPR 140 can also send and receive status, control and feedbacks from the Receiving Node 102 via a connection 107.

For a bi-directional communication link between the Transmitting Node 104 and Receiving Node 102, an exemplary embodiment can use an IAPR 140 and IAPT 142 pair in association with each one of the nodes, instead of just an IAPT 142 or just an IAPR 140 associated to each one of the nodes. Another exemplary embodiment can use one module that combines elements of an IAPR 140 and an IAPT 142. Such a combined module can be referred to as a combined-intermediate-adaptive-protection device (CIAPD). A CIAPD can be installed in association with each one of the nodes (i.e., IAPT 102 and IAPR 104), for example.

In an exemplary embodiment, the IAPT 142 can act as a master of the IAPR 140. In such an embodiment, the IAPT 142 can decide when to start an SNR sensing process. As presented above, the timing of when to sense the SNR can be based on a timer or feedback information received from the IAPR 140, for example. The IAPT 142 can notify the IAPR 140 on the initiation of the sensing procedure via link 144, etc.

Figure 2A:
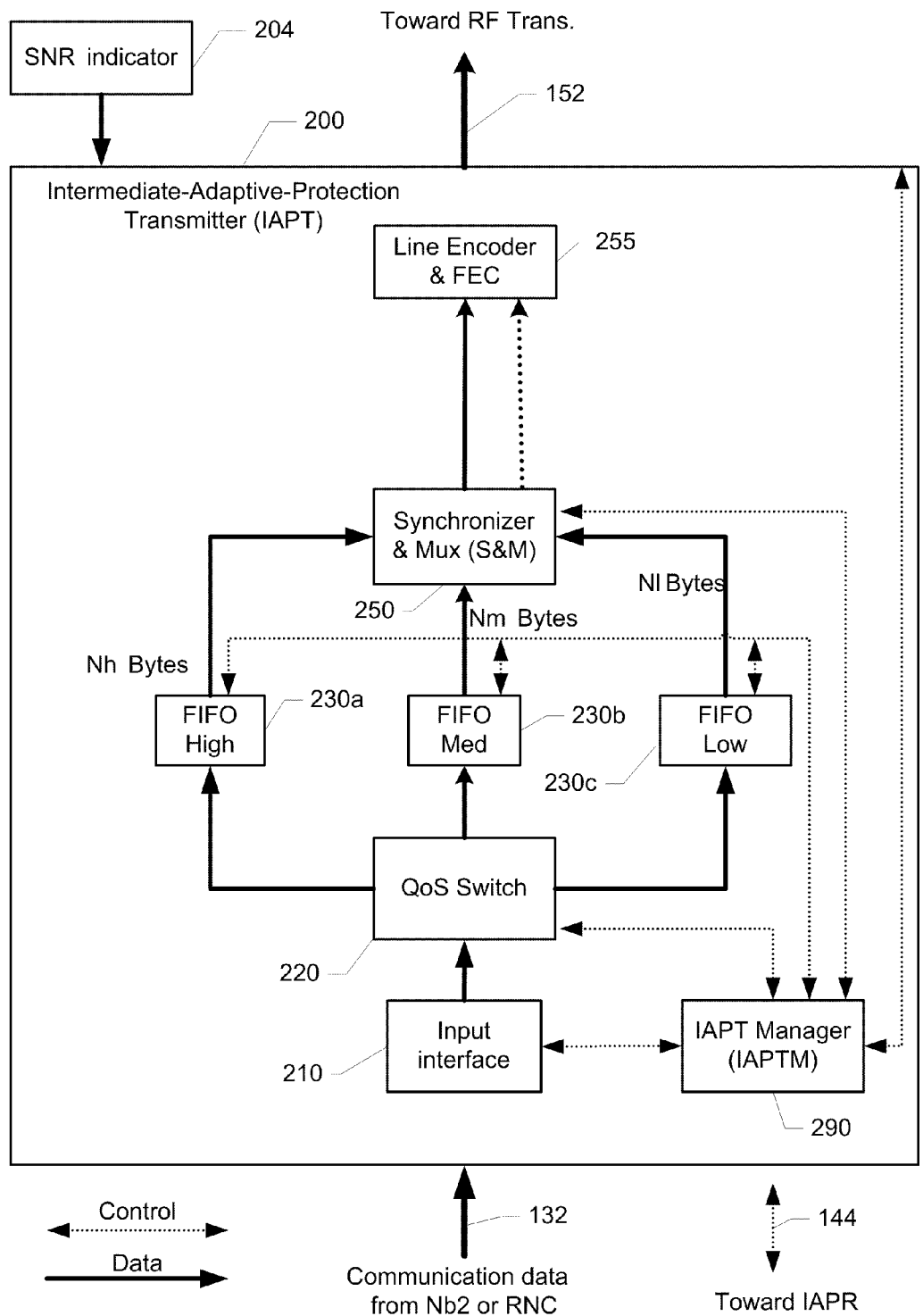
FIG. 2A and FIG. 2B schematically illustrate simplified block diagrams with relevant elements of an exemplary Intermediate-Adaptive-Protection Transmitter (IAPT) that operates according to exemplary teachings and techniques of the present disclosure.
Figure 2B:
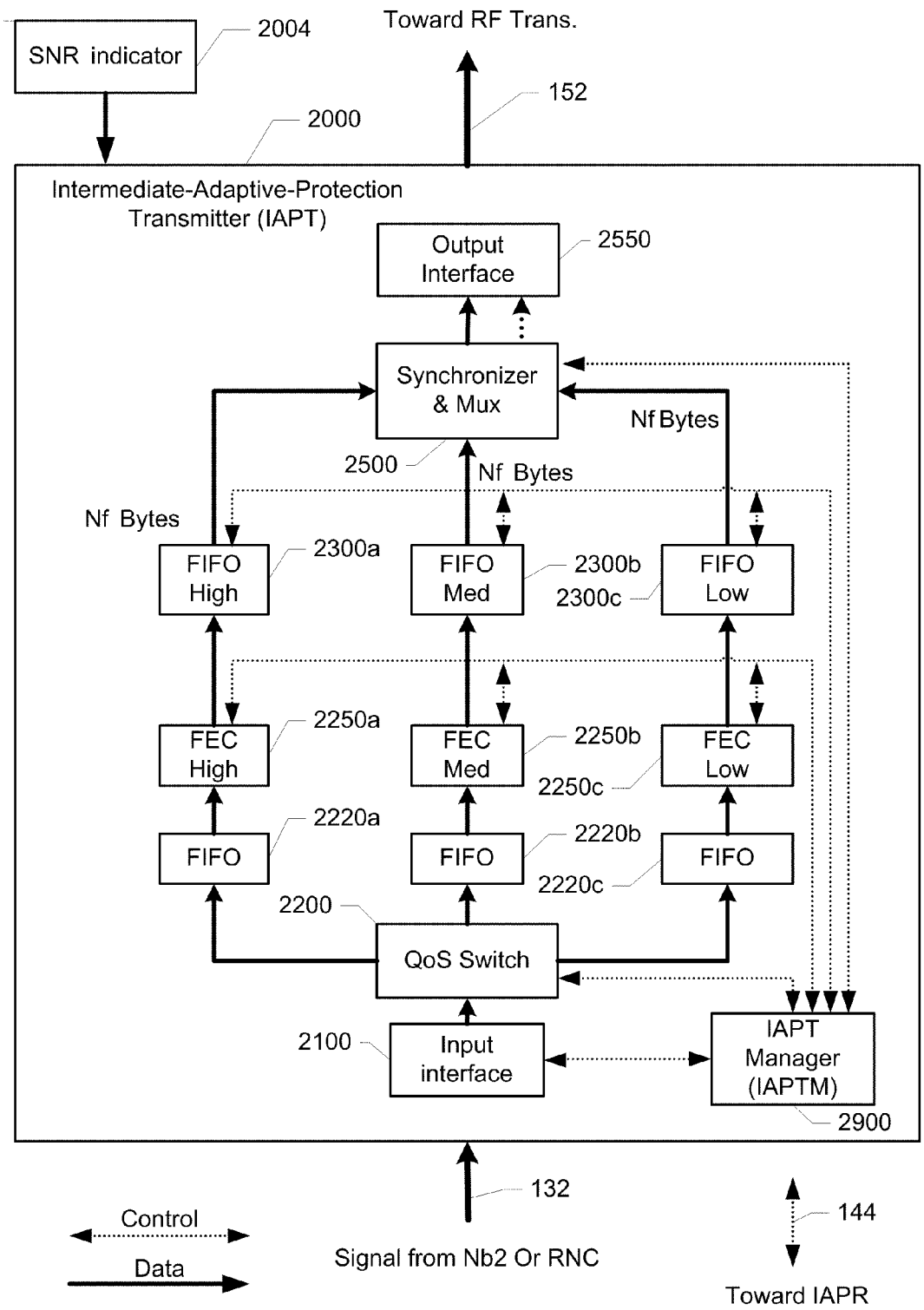

FIG. 2A and FIG. 2B schematically illustrate simplified block diagrams with relevant elements of an exemplary Intermediate-Adaptive-Protection Transmitter (IAPT) that operates according to exemplary teachings and techniques of the present disclosure. In FIG. 2A, the block diagram illustrates the relevant elements of an exemplary implementation of an Intermediate-adaptive-protection transmitter 200 (IAPT). The IAPT 200 can receive a stream of frames for different communication sessions from Nb2 or RNC 104 (FIG. 1) via communication link 132. A frame can take on a variety of forms depending on the underlying network over which the frame was transmitted. For instance, a frame can be a packet if the data link is tunneling over an IP network, such as the GMPL/MPLS network. Likewise, a frame can be an Ethernet frame if the data link network is the Ethernet. In addition, a frame can be an ATM cell if the data link network is ATM, etc. Henceforth, the description, drawings and claims of the present disclosure may use the term frame as a representative term for an Ethernet frame, IP packet, ATM cell, or any other data structure for other networks.

The stream of bits or data that is received at the input interface 210 includes multiple frames with each of the frames may being associated with one of a variety of different communication sessions. The input interface 210 may parse and process the stream of bits at the OSI physical layer and deliver a stream of frames. Input interface 210 can add a sequence number (SeqNum) to each received frame. For example, the SeqNum can be added after the QoS label. The QoS label can be a GMPLS/MPLS label or a header of an ATM cell, for example. From time to time, input interface 210 can update an IAPT manager 290 (IAPTM) with regards to the QoS and the SeqNum of the received communication sessions. The input interface 210 can then transfer the processed stream of frames toward a QoS switch 220.

The QoS switch 220 can separate the received stream of frames and send each frame over a path, selected at least in part based on the QoS associated with the communication session for which the frame is associated and, a path that is designed to support the identified QoS level. The QoS switch 220 can also divide each frame into data segments. Each data segment of the frame can be sent out of the output of the QoS and routed by the QoS switch 220 over the path selected for that particular frame. The output of the QoS switch 220 can be associated with a plurality of different paths. An exemplary number of paths can be between 2 to 5. For simplicity of the description, only 3 paths are illustrated in FIG. 2A at the QoS switch output. Each path can comprise: a FIFO 230*a-c*, a synchronizer and mux 250 (S&M), and a Line encoder and FEC 255, for example. The S&M 250 and the line encoder & FEC serve all the paths.

The FIFO 230*a* can be used to buffer communication segments of a session with high QoS requirements, while FIFO 230*b* can be used to buffer communication segments of a session with medium QoS requirements and FIFO 230*c* can be used to buffer communication segments of a session with low QoS requirements, such as best effort for example. Each FIFO 230*a-c* can have a connection to the IAPTM 290, for feedback and status information. If for example one of the FIFOs is empty then IAPTM 290 can inform IAPR 140 (FIG. 1) and instruct S&M 250 to skip that FIFO, for example.

Synchronizer and mux 250 (S&M) can fetch blocks of data segments, in different sizes, from each FIFO 230*a-c*. A block can have a pre-defined number of bytes (Nh/Nm/N1) of integer number of data segments. Wherein Nh is the number of bytes for the high path, Nm is for the medium path and N1 is for the low QoS path. To deliver a better BER protection to the high QoS path, then the relationship between the block sizes should be N1>Nm>Nh.

The S&M 250 can operate in two modes: synchronize mode and run mode. The S&M 250 operates in synchronize mode (sync mode) from time to time (i.e., during an initiation), upon losing synchronization with the IAPR 140, or periodically (i.e., once every few hours). In the sync mode, the S&M 250 can generate a repeated Sync-String of bytes. A Sync-String can be a sequential number with a CRC, for example. When the S&M 250 is in a run mode, it can fetch a block of different number of bytes (Nh/Nm/N1) of integer number data segments from each FIFO 230*a-c*, and then mux them into a stream comprised of a plurality of different communication blocks. The mux data can then be transmitted toward the line encoder and FEC 255. During an exemplary period of time, the S&M 250 can fetch data from the available FIFOs. As a non-limiting example, the S&M 250 can fetch a block of 300 bytes from the high QoS path FIFO 230*a*, a block of 600 bytes from the medium QoS path FIFO 230*b*, and a block of 900 bytes from the low QoS path FIFO 230*c*.

In parallel to sending the blocks of data segments, The S&M 250 can provide instructions to the Line Encoder and FEC 255 with regards to how to handle (modulation and FEC) the data blocks. The instructions can be sent out of band via a control connection between the S&M 250 and the Line Encoder and FEC 255, for example. However, in other embodiments, the instruction can be sent in-band by adding an adaptive-protection header, for example. The adaptive-protection header can be a predefine number of bytes that are placed at the beginning of each data segment, for example. The adaptive-protection header can indicate the required modulation and FEC for the segments, for example. The adaptive-protection header can also indicate the number of bytes for each communication segment, a beginning of a frame, etc.

The adaptive-protection header can be added by the QoS switch 220, or by the S&M 250 according to instructions received from IAPTM 290 at the beginning of a synchronize mode. The instructions can be received via a control connection with IAPTM 290, for example. An exemplary adaptive-protection table can comprise the adaptive modulation, FEC, and number of bytes for each adaptive-protection header, as a function of the QoS of each path. In some embodiments the table can also be a function of the current SNR. The header can direct the Line Encoder and FEC 255 and/or the IAPR as to how to handle the data segments.

At the Line Encoder and FEC 255, blocks of data segments received from the S&M 250 are modified based at least in part on the instructions that are embedded in-band, in the adaptive-protection header or alternatively according to the instructions that are received out of band. The modified stream of bits is forwarded, toward the RF transmitter 154 (FIG. 1) via communication link 152.

In some embodiments, to define the appropriate BER protection, the IAPTM 290 can obtain SNR measurements from an SNR indicator 204 associated with the communication link 150 (FIG. 1). In other embodiments, the IAPTM 290 may receive an indication regarding the number of errors received on the other end of communication link 150 (i.e., at the mating IAPR), and accordingly, the IAPTM 290 can calculate the current SNR. In some embodiments, the BER protection is indifferent to the current SNR but rather, is only a function of the QoS.

From time to time the IAPTM 290 can get instructions from an administrator of the network with regards to how to handle the different QoS levels. According to those instructions, the IAPTM 290 can instruct, via a control connection, the QoS 220 as to which one or more QoS labels to route to a certain path. The S&M 250 can be instructed, via a control connection, with regards to the block size and the number of data segments, to collect from each path, etc.

FIG. 2B illustrates a block diagram showing relevant elements of another exemplary implementation of an Intermediate-adaptive-protection transmitter 2000 (IAPT). The illustrated IAPT 2000 can get, from the transmitting node 104 (FIG. 1) via communication link 132, a stream of a plurality of frames, associated with different communication sessions, to be transferred toward the Receiving Node 102 (Nb1). The stream can first enter through an input interface 2100. The input interface 2100 can parse and process the OSI data link layer of the received stream and deliver a stream of frames. Input interface 2100 can add a sequence number (SeqNum) into or in association with the header of each frame. For example, the SeqNum can be added after the QoS label of each frame of the different communication sessions. The QoS label can be a GMPLS/MPLS label, a header of an ATM cell, or otherwise depending on the underlying network and the employed protocol. The frames with the SeqNum are transferred toward the QoS switch 2200. Input interface 2100 performs similar tasks as the input interface 210 described above in conjunction with FIG. 2A, and therefore is not be further described.

The QoS switch 2200 can separate the received stream of frames into two or more paths in accordance with the QoS that is entitled or targeted for each frame. At each path, the QoS switch 2200 can further divide the stream of frames delivered to the path into a stream of data segments. In various embodiments, the number of paths may vary with an exemplary number of paths ranging between 2 to 5, but, it is anticipated that more or less paths may also be supported. In the illustrated embodiment, only 3 paths have been illustrated to simply the description. Each path is illustrated as including at least: an FIFO 2220, an FEC 2250*a-c* encoder, a FIFO 2300*a-c*, and a synchronizer and mux 2500 (S&M) that serves all the paths, for example. From time to time, the QoS switch 2200 may get commands from an IAPTM 2900 with regards to which QoS labels are to be routed on which path. FIFOs 2220 at each path are used as buffers between the relevant FEC 2250*a-c* and the QoS switch 2200.

In each path, a different bit error rate protection method can be implemented by the relevant FEC encoder 2250*a-c* on the data segments, changing the data segments into to an adapted-protected data segment. Exemplary FEC methods can implement Reed Solomon, or LDPC algorithm, for example, which are well known and will not be further described. In each path, data segments can be protected differently from data segments in the other communication session segments passing through the same communication link 150. Each FEC encoder 2250*a-c* can add a different number of FEC bits to the received data segments. For example, the FEC High 2250*a* can triple the number of bits, while the FEC Med 2250*b* can double the number of bits and the FEC Low 2250*c* does not add any FEC bits. The level of protection (the extra FEC bits) in each path can be defined by the IAPTM 2900 via a status and control connection. Similar to the embodiment illustrated in FIG. 2A, and SNR indicator 2004 may also be used to provide feedback regarding the bit error rate and adjustments can be made at least partially on this feedback information.

The FIFO 2300*a* can be used to buffer adapted-protected data segments of sessions with high QoS requirements, while the FIFO 2300b can be used to buffer adapted-protected data segments of sessions with medium QoS requirements and the FIFO 2300c can be used to buffer adapted-protected data segments of sessions with low QoS requirements such as best effort. Each of the FIFOs 2300a-c can have a status and control connection to the IAPTM 2900. If, for example, one of the FIFOs is empty, then the IAPTM 2900 can inform the IAPR 140 (FIG. 1) and the S&M 2500 to skip that FIFO.

In a similar way to the above-described S&M 250, synchronizer and mux 2500 can operate in two modes: sync mode and run mode. In the sync mode, the S&M 2500 can generate a repeated synchronization sequence (Sync-String). A Sync-String includes multiple bytes and can be a sequential number and a CRC, for example.

When the S&M 2500 is in run mode, the S&M 2500 can fetch a block of adapted-protected data segments from each FIFO. A block can be constructed of a pre-defined number of adapted-protected data segments from each of its input. In this exemplary embodiment of an IAPT, from each FIFO 2300a-c the same amount (Nf) of adapted-protected data segments is fetched and passed through the S&M 2500.

The S&M 2500 can then transfer the blocks of adapted-protected data segments from the different paths to an output interface 2550. In some embodiments, together with the stream of different communication blocks, the S&M 2500 can transfer instructions regarding to the required modulation. These instructions would typically be provided to the RF transmitter 154 (FIG. 1). The instructions can be sent over an in-band channel by adding an adaptive-protection header. The adaptive-protection header can indicate to the RF transmitter 154 (FIG. 1) the required new modulation for the blocks, as well as the number of bytes included in the block. The instructions can include, among other information: an indication that the FIFO is empty and to skip to the next path; an indication of the beginning of a frame, etc. In other embodiments, the instructions can be sent out of band (not shown in drawing). In yet other embodiments all paths may have the same modulation and thus eliminate the need for such instructions.

An exemplary IAPTM 2900 can perform similar tasks as the previously-described IAPTM 290 of FIG. 2A and therefore, will not be further described. More information regarding the operation of the IAPT 200 and 2000 is disclosed below in conjunction with the description of FIG. 4A, FIG. 4B and FIG. 4C.

Figure 3A:
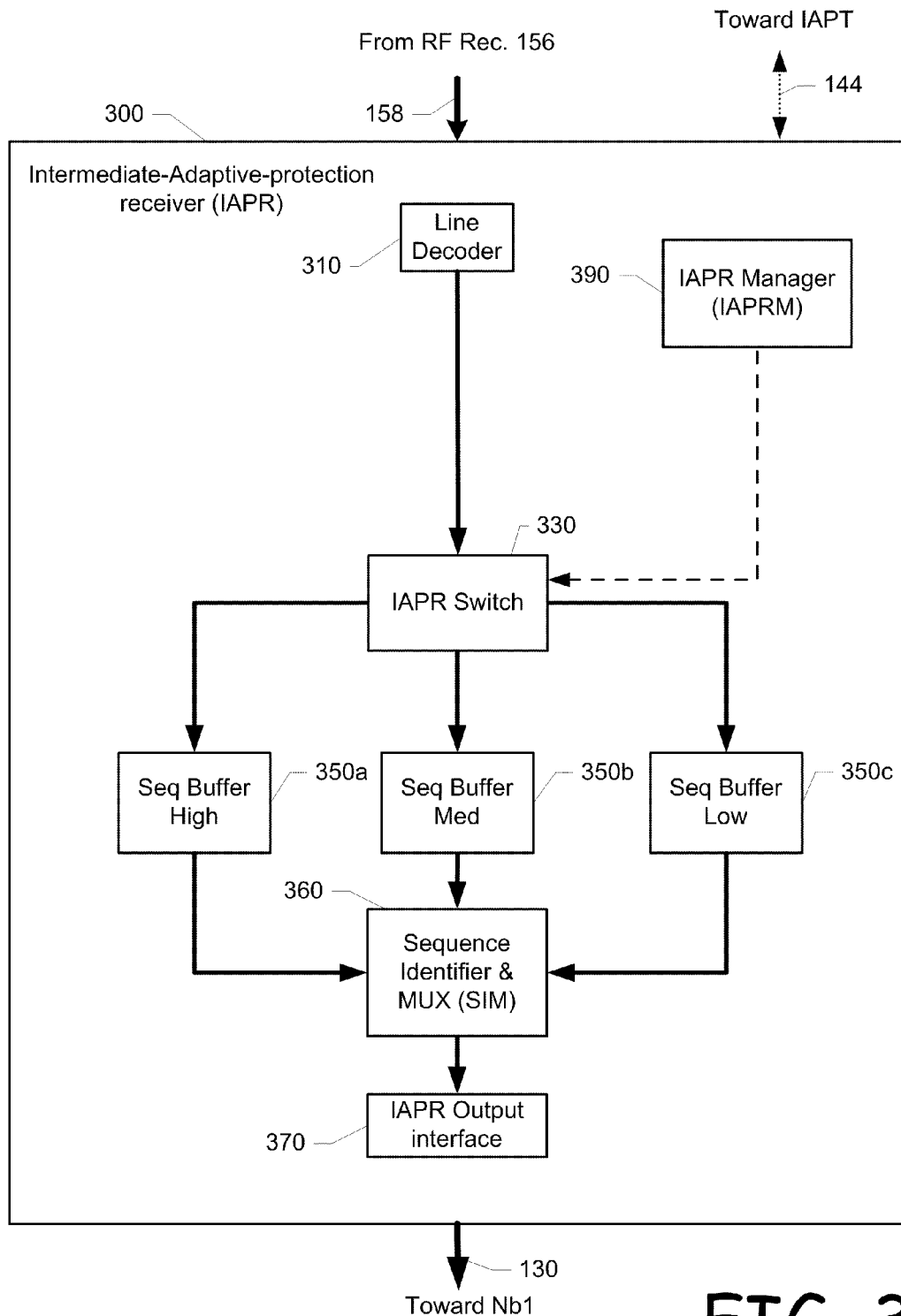
FIG. 3A and FIG. 3B schematically illustrate simplified block diagrams with relevant elements of an exemplary Intermediate-Adaptive-Protection Receiver (IAPR) that operates according to certain exemplary techniques of the present disclosure.
Figure 3B:
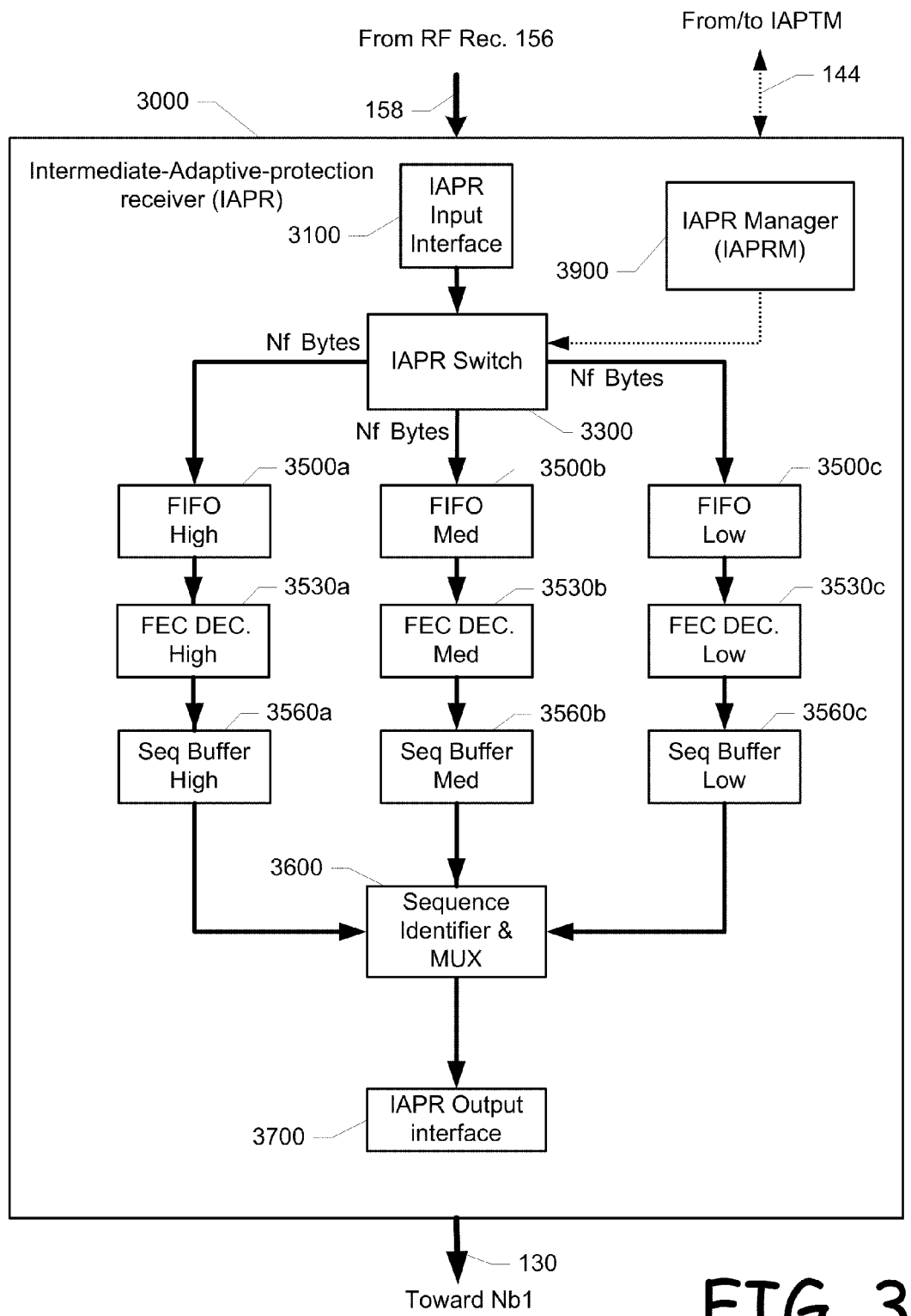

FIG. 3A and FIG. 3B schematically illustrate simplified block diagrams with relevant elements of an exemplary Intermediate-Adaptive-Protection Receiver (IAPR) that operates according to certain exemplary techniques of the present disclosure. FIG. 3A illustrates a block diagram with relevant elements of a first exemplary implementation of an Intermediate-adaptive-protection receiver 300 (IAPR). The IAPR 300 can act as a mate of the IAPT 200 (illustrated in FIG. 2A). The IAPR 300 may include, among other elements, an IAPR Manager 390 (IAPRM). The IAPR Manager 390 can communicate with the IAPT Manager 290 (FIG. 2A). The communication can be in-band, or out of band via communication link 144 (FIG. 1). The data passed through the link 144 between the IAPRM 390 and IAPTM 290 may include status and control information such as but not limited to information regarding the mode of operation and/or the adaptive-protection table updates.

The IAPR 300 can receive a stream that includes a plurality of different adapted-protected blocks from RF receiver 156 (FIG. 1) via communication link 158. Initially, the stream enters a line decoder 310. The line decoder 310 can communicate with the line encoder & FEC 255 (FIG. 2) and receive different instructions. The instructions can include, but are not limited to, identifying for each block: the modulation used, the FEC used, etc. The instructions can also provide information identifying with which path the receive stream is associated. The number of paths in the IAPR 300 is similar to the number of paths used in its mated IAPT 200. Although an exemplary number of paths can range between 2 to 5, more or fewer paths are also anticipated. In the exemplary embodiment illustrated in FIG. 3A, only three (3) are shown to simply the description. Each path may include, among other things: a line decoder 310, an IARP switch 330, a sequence buffer 350a-c, and a sequence identifier and mux (multiplexer) 360 (SIM). The line decoder 310, the IAPR switch 330 and the identifier and mux 360 serve the all three paths.

The communication between the line decoder 310 and the Line encoder & FEC 255 (FIG. 2) can be through an out of band connection (not shown in drawings), or in-band connection. The pair of the line encoder & FEC 255 and the line decoder 310 can be PVG310 made by Provigent Israel, for example.

The line decoder 310 can deliver blocks of data segments to an IAPR switch 330 and the blocks can be in different sizes. The number of bytes in the data segments is an integer number and can be Nh/Nm/N1 bytes. In the run mode, the IAPR switch 330, based on the adaptive-protection header of each received segment and/or block and in accordance with an adaptive-protection table, can de-mux and route the received adapted-protected blocks of segments to the required path. The IAPR switch 330 can route the adapted-protected blocks in a cyclic mode to a plurality of sequence buffers 350a-c, one sequence buffer per path. The IAPR switch 330 can transfer a block of consecutive Nh bytes to Sequence buffer High 350a, the following block of Nm consecutive bytes to Sequence buffer Med 350b and the next block of N1 consecutive bytes to Sequence buffer Low 350c. Then a new cycle can be started.

If a change in the measured SNR is detected, a new sync mode can be initiated by IAPTM 290 (FIG. 2A). The IAPR switch 330 can identify a beginning and an end of a sync mode by an in-band or out of band signal. An in-band signal can be a pre-defined header, for example. In an exemplary embodiment of the IAPR 300, the IAPR switch 330 can also identify a situation in which a FIFO 230 (FIG. 2A) is empty and was thus skipped at the mate IAPT 200 (FIG. 2). Accordingly, the IAPR switch 330 can skip an appropriate Seq. Buffer 350a-c and store the next block of segments in the following Seq. buffer 350a-c.

The deep of each Seq Buffer (the number of bytes in each entry, address, of the buffer) is a function of the size of the data frames that are transferred between the transmitting node 104 and the receiving node 102 (FIG. 1). Data segments of the same frame are stored in the same entry of the Seq. Buffers 350a-c in the address that is similar to the SeqNum of the frame. The SeqNum of the frame was added by the input interface 210 (FIG. 2a) of IAPT 200 (FIG. 2a). Consequently, the original data frames are restored by the IAPR Sw. 330 in the Seq. Buffer 350a-c.

Each sequence buffer 350a-c can have a writing mechanism and reading mechanism that are independent. Each sequence buffer 350a-c can have one or more status bits at each address (read/write enable status) for indicating whether the address is ready to be read or written. When the status bit indicates that the write-mode is enabled in a certain entry of the buffer, then a device or process can write into that entry. When the status bit indicates that the read-mode is enabled in a certain entry of the buffer, then it indicates that the entry is ready to be or that it has to be read. For each data segment, writing into the buffer can be performed by writing into an address that is similar to the sequential number (SeqNum) of the relevant frame to which the data segment belongs. Writing into each Seq. Buffer 350a-c can be executed by the IAPR Switch 330 parsing the SeqNum and then storing the data in the appropriate address.

A Sequence identifier and mux 360 (SIM) can drain the frames stored at the sequence buffers 350a-c. In an exemplary embodiment, the SIM 360 operates to drain the data frames based at least in part, on the sequential number (SeqNum) associated with each frame. For example, the SIM 360 can start searching the Seq Buffers 350a-c to find the frame with the lowest SeqNum and then, drain that frame until the SIM 360 identifies a header of a new frame (i.e., a GMPLS/MPLS packet, an ATM cell, etc). At this point, the SIM 360 resume searching the sequence buffers 350a-c to identify the frame with the next SeqNum. If the SIM 360 finds such an entry, the SIM 360 can start draining the relevant sequence buffer. This process is then repeated by the SIM 360. The frames that are drained from the sequence buffers by the SIM 360 are then transferred to an IAPR output interface 370.

An IAPR output interface 370 operates to receive frames from the SIM 360 and then transfers the frames toward the Nb1 102 (FIG. 1) via communication link 130. IAPR output interface 370 can process the data in accordance with the OSI physical layer protocol of the communication link 130, and output the processed data as a bit stream.

FIG. 3B illustrates a block diagram showing exemplary relevant elements of an alternate exemplary implementation of an Intermediate-adaptive-protection receiver 3000 (IAPR). The IAPR 3000 can act as a mate to the IAPT 2000 (FIG. 2B). The IAPR 3000 may include, among other elements, an IAPR Manager 3900 (IAPRM). The IAPR Manager 3900 can communicate with the IAPT Manager 2900 (FIG. 2B) either over an in-band channel, or an out of band path over communication link 144. The information that passes through the communication link 144 may include, among other information, the current mode of operation and/or the adaptive-protection table updates.

The IAPR 3000 can receive a stream that contains multiple adapted-protected blocks of differing sizes from the RF receiver 156 (FIG. 1) via communication link 158. The stream, which may include multiple different adapted-protected blocks, enters via the IAPR input interface 3100. The IAPR input interface 3100 may receive the stream by processing the OSI physical layer of the communication link 158.

An IAPR switch 3300 can receive the processed stream from the IAPR input interface 3100. At this point, the processed stream includes a plurality of different adapted-protected blocks of bytes. Each of the blocks includes an integer number of adapted protected data segments together with instructions. The instructions may include, but are not limited to, information regarding the number of bytes to expect in each block, the FEC used, etc. The instructions may also include information identifying the path with which the current received block is associated. The association between the received blocks and paths depends on the bit error rate protection method the path used in the IAPT 2000 (i.e., which path in IAPT 2000 sent the relevant block). There can be a plurality of paths in the IAPR 3000. The number of paths is similar to the number of paths in the mating IAPT 2000 (i.e., can be between 2 to 5, for example, but more and less numbers of paths are also anticipated). Only three paths have been illustrated in the drawings to simplify the description. Each path may include, among other elements: an IAPR switch 3300, a FIFO 3500a-c, an FEC decoder 3530a-c, a sequence buffer 3560a-c, and a sequence identifier & mux 3600 (SIM). The IAPR switch 3300 and the SIM 3600 serve all the paths while the FIFOs 3500a-c, the FEC decoders 3530a-c and the sequence buffers 3560a-c are path specific.

In run mode, the IAPR switch 3300, based at least in part on the adaptive-protection header received and in accordance with an adaptive-protection table, can demultiplex (de-mux) and route the received data blocks. Yet in some embodiments the IAPR switch 3300 can route the different adapted-protected blocks in a cyclic mode to a plurality of FIFOs 3500a-c associated to its output. The IAPR switch 3300 can transfer a block of consecutive Nf bytes to FIFO High 3500a, the following block of Nf consecutive bytes to FIFO Med 3500b and the next block of Nf consecutive bytes to FIFO Low 3500c. This sequence completes a full cycle and then, a new cycle is started.

If there is a change that has an effect on the data transmission, for example a change in the measured SNR, a new sync mode can be initiated by the IAPTM 2900 (FIG. 2B). The IAPR switch 3300 can identify a beginning and an end of a sync mode by an in-band or out of band signal. An in-band signal can be a pre-defined header, for example. In some embodiments, the IAPR switch 3300 can also identify if and when a FIFO 2300 (FIG. 2B) is empty and therefore, conclude that it was skipped. In response the IAPR switch 3300 can route the following data to the next path.

The FIFOs 3500a-c can be used as buffers between the IAPR switch 3300 and each of the FEC decoders 3530a-c. The output of each FIFO 3500a-c is drained by the FEC decoder 3530a-c. The FEC decoders operate to decode the adapted-protected data segments according to the adaptive-protection table received from the mating IAPTM 2900 (FIG. 2B). In some embodiments, a specific FEC algorithm is implemented in each path and therefore, the FEC decoder does not need to make a determination as to which FEC algorithm was used. An exemplary FEC decoder can use a forward error correction algorithm such as, but not limited to, low-density parity-check code (LDPC), Reed Solomon, or other well known, publicly known or proprietary algorithm. Because such techniques are well known in the art, the specifics of the FEC algorithm are not described. The data segments at the output of the FEC decoders are stored in sequential buffers, Seq. Buffers 3560a-c.

The Seq. Buffers 3560a-c perform similar tasks as the sequential buffers 350a-c in FIG. 3A such as restoring the received frames and storing them according to their SeqNum, and thus are not further described here.

A Sequence identifier & mux 3600 (SIM) operates in a similar way to the SIM 360 of FIG. 3A and drains the stored frames in the Seq. Buffers 3560a-c according to their SeqNum, and then transfers the frames toward the IAPR output interface 3700.

The IAPR output interface 3700 operates to receive decoded data frames from the SIM 3600, and then transfers them toward the Nb1 102 (FIG. 1) via communication link 130. The output interface 3700 can process the data in accordance with the OSI physical layer protocol employed by the communication link 130, to be output as a stream of bits. More information regarding the details of operation of various embodiments of the IAPR 300 and 3000 is disclosed below in conjunction with the description of FIG. 5A, FIG. 5B, FIG. 5C and FIG. 5D.

Figure 4A:
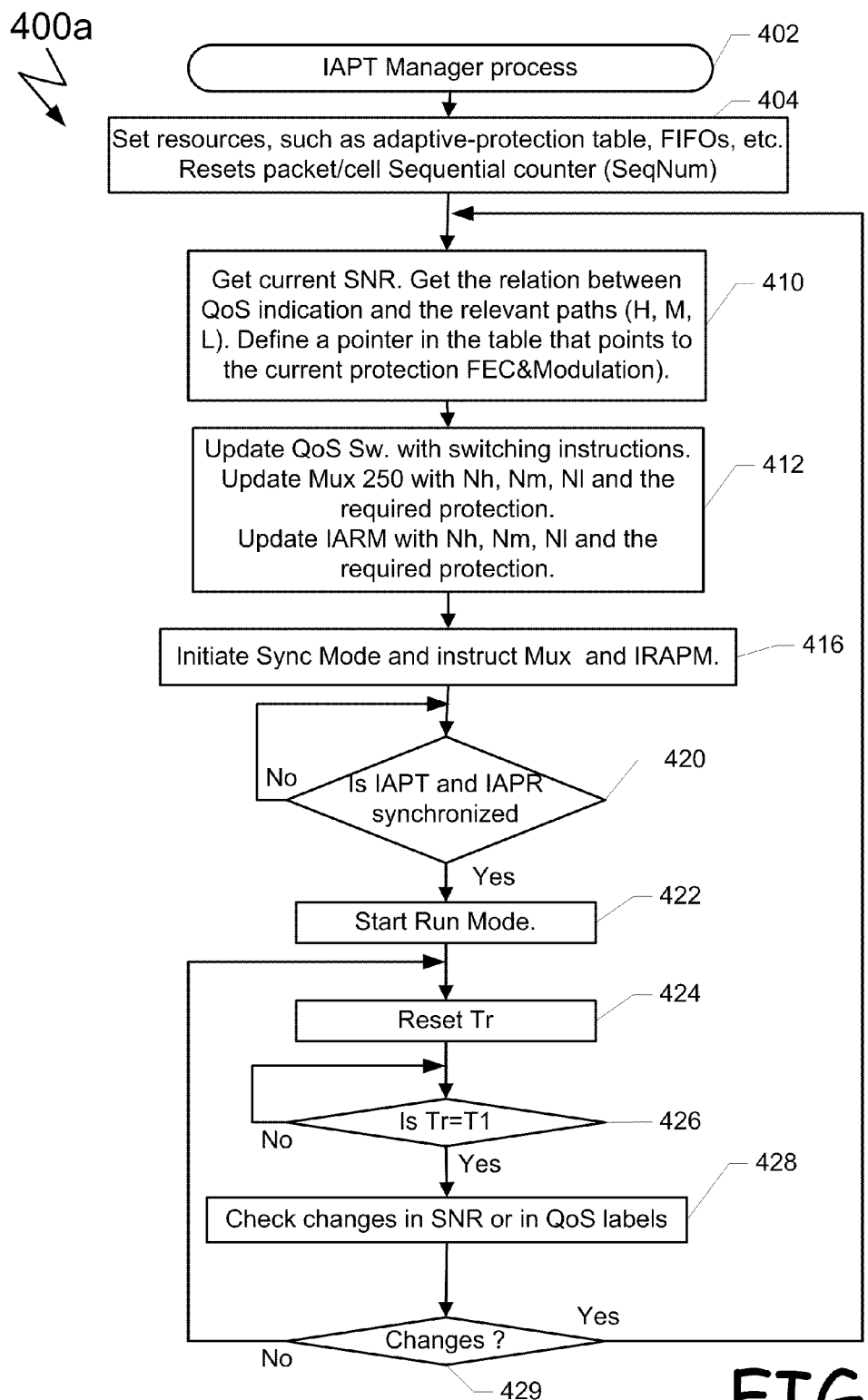
FIG. 4A schematically illustrates a flowchart showing relevant processes of an exemplary method of an IAPT manager, according to exemplary techniques of the present disclosure.

FIG. 4A schematically illustrates a flowchart showing relevant processes of an exemplary method of an IAPT manager, according to exemplary techniques of the present disclosure. The illustrated flowchart shows an exemplary method 400a which can be executed 402 by an IAPT manager 290 and/or 2900 (FIG. 2A or 2B), for example.

The exemplary method 400a may be initiated 404 upon power on or reset, for example. During initiation 404, the IAPTM 290 and/or 2900 can be introduced to the components of the IAPT 200 or 2000 (FIG. 2A or 2B) and to the IAPR Manager 390 or 3900 (FIG. 3A or 3B) respectively via communication link 114. In addition, a connection with Transmitting Node 104 (FIG. 1) via link 132 and a connection with the RF transmitter 154 (FIG. 1) via link 152 can be established. Relevant resources may be allocated and reset and/or set. The allocated resources may include, but are not limited to: FIFOs 230 or 2300 (FIG. 2A and/or FIG. 2B), sequential buffers 350 and/or 3560 (FIG. 3A and/or FIG. 3B), adaptive-protection header tables, a timer (Tr), and so on.

The method 400a can operate to receive 410 SNR measurements and BER protection requirements according to the different levels of the QoS targeted or required for the different communication sessions. The QoS levels can be found in the headers of the data frames such as, but not limited to: the labels in GMPLS/MPLS or ATM cells headers, for example. The method 400a can define 410 a pointer to the relevant entries in the adaptive-protection header tables according to the SNR and the QoS. According to the number of BER protection levels employed, the method 400a may define 412 the number of paths that will be active. The method 400a can update 412 the QoS switch 220 and/or 2200 (FIG. 2A and/or FIG. 2B), and the IAPR QoS 330 and/or 3300 (FIG. 3A and/or FIG. 3B) with regards to the number of paths. The method 400a can update the S&M 250 (FIG. 2A) and the IAPR manager 390 (FIG. 3A) regarding the number of bytes Nh/Nm/Nl or Nf for each block and the required FEC and modulation protection.

Next the method 400a may initiate 416 the synchronize mode. Relevant components of the IAPT and the IAPR can be set for the synchronize mode: components such as but not limited to: the synchronize and Mux 250 and/or 2500 (FIG. 2A and/or FIG. 2B), the IARP switch 330 and/or 3300 (FIG. 3A and/or FIG. 3B), the IAPRM 390 and/or 3900 (FIG. 3A and/or FIG. 3B), etc. Next at decision block 420, it is determined whether or not the IAPR and the IAPT have been synchronized. If 420 not, then method 400a waits until synchronization has been achieved. However, if it is determined that the IAPR and IAPT are synchronized 420, then method 400a proceeds to step 422.

At step 422 method 400a enters into the run mode. Upon entrance into the run mode, a timer Tr is reset 424. Next at decision block 426, the method 400a is shown as making a determination regarding the value of the timer Tr 426, by comparing it to a value T1. T1 can be few milli seconds to few minutes, depending on the specific embodiment. If the timer Tr is not equal to T1 426, then method 400a waits until Tr does equal T1 by looping back to decision block 426 and again comparing Tr to T1. When 426 Tr equals T1, then the method 400a can check 428 if new and/or different SNR measurements are available and/or whether there have been any changes in the BER protection requirements according to the levels of the QoS. If 429, there are no changes or the changes are less then a pre-defined threshold value, then the method 400a continues operating by returning to step 424 to reset the value of timer Tr. However, if there are changes in the SNR or QoS requirements, or the changes are more then a threshold value 429, then the method 400a continues operating by returning to step 410 where the method 400a again receives SNR measurements and BER protection requirements according to the different levels of the QoS targeted or required for the different communication sessions.

In some embodiments, the number of paths of BER protection levels may be fixed and indifferent to changes in SNR. In such embodiments, the exemplary method 400a illustrated in FIG. 4A can actually terminate when the run mode is entered 422.

Figure 4B:
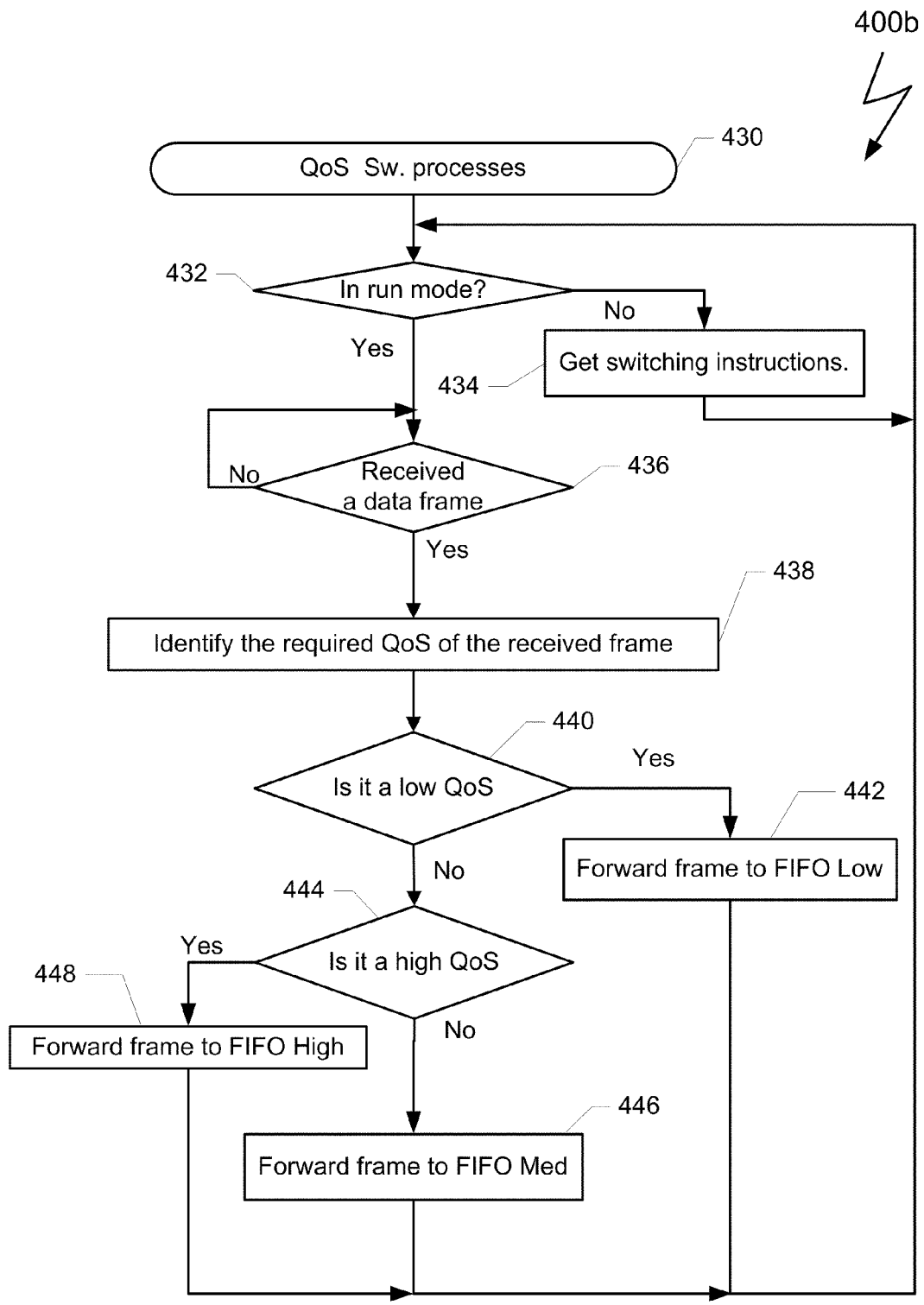
FIG. 4B schematically illustrates a flowchart showing relevant processes of an exemplary method of a QoS switch, according to exemplary techniques of the present disclosure.

FIG. 4B schematically illustrates a flowchart showing relevant processes of an exemplary method of a QoS switch, according to exemplary techniques of the present disclosure. The illustrated flowchart presents relevant processes of an exemplary method 400b. The method 400b can be executed 430 by QoS switch 220 and/or 2200 (FIG. 2A or FIG. 2B), for example or other systems, elements or a combination thereof.

The method 400b initially performs a check 432 to determine the current operating mode (run or sync). If this check 432 determines that the current mode of operation is the synchronize mode, then method 400b can fetch 434 instructions and act upon them. The instructions, among other things, may identify which level of QoS to route a frame, a starting value and a range for the SeqNum, etc. The instructions can be received from the IAPT manager 290 (FIG. 2A), etc. If however the check 432 determines that the current mode of operation is the run mode, then a decision needs to be made 436 as to whether or not a data frame has been received. If a data frame has not been received 436, then the method 400b waits until a data frame is received. However, if and when a data frame has been received 436, then method 400b proceeds to step 438. At step 438 the method 400b identifies the level of QoS of the received data frame. The QoS level can be identified 438 using a variety of techniques depending on a variety of factors such as network types, protocol types, etc. As a non-limiting example, one such includes parsing the header of the data link layer of the received frame.

Next, the method 400b determines how to route the frame, based at least in part on the identified QoS level and, the QoS level associated with the available paths. This determination can be performed in a variety of manners, including looking up the QoS levels for each available path in the adaptive protection table, or if the values are fixed, comparing the identified QoS with constant values. If the method 400b determines that the identified QoS level for the received packet is a low QoS level 440, then the communication frame is then sent 442 to the FIFO Low 230c or FIFO 2220c associated with the low path (FIG. 2A or FIG. 2B) and method 400b returns to step 432. If the method 400b determines that the identified QoS level is a high QoS level 444, then the data frame is sent 448 to the FIFO high 230a or the FIFO 2220 associated with the high path (FIG. 2A or FIG. 2B) and the method 400b returns to step 432. If the method 400b determines that the identified QoS level is a medium QoS level, then the data frame is sent 446 to the FIFO Med 230b or the FIFO 2220 associated with the medium path (FIG. 2A or FIG. 2B) and method 400b returns to step 432 to verify the run mode is still active. In other embodiments the number of paths can be greater or less than three. It should be appreciated that although the illustrated embodiment shows that the method 400b operates to first determines if the identified QoS is low, then high and then medium, that in actuality these steps can be performed in any order. In addition, rather than an if-then structure comparison, the comparison can be made using a hash function, a switch function or other similar techniques employed in the art.

Figure 4C:
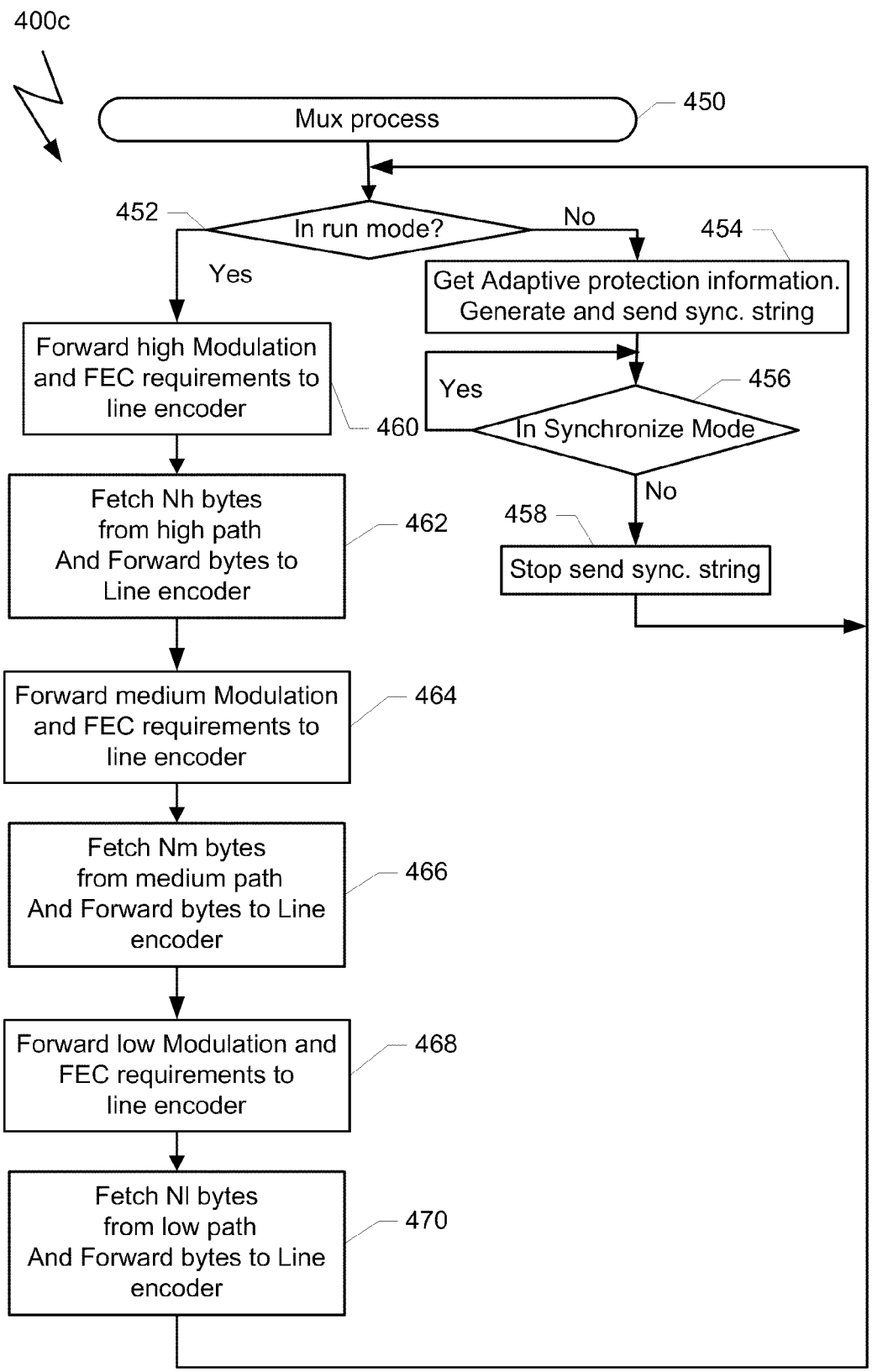
FIG. 4C schematically illustrates a flowchart showing relevant processes of an exemplary method of a synchronize and Mux, according to exemplary techniques of the present disclosure.

FIG. 4C schematically illustrates a flowchart showing relevant processes of an exemplary method of a synchronize and multiplexer, according to exemplary techniques of the present disclosure. The illustrated flowchart shows relevant processes of an exemplary method 400c. The method 400c can be executed 450 by the Synchronize and MUX 250 or 2500

(FIG. 2A or FIG. 2B), for example, or it can be executed by other components or a combination of one or more components. Upon initiation of the method 400c, the method 400c checks the current mode of operation 452. If the current mode of operation is the synchronize mode, then the method 400c operates to fetch adaptive protection information 454. The adaptive protection information can be fetched from the adaptive-protection table received from the IAPTM 290 or 2900 (FIG. 2A or FIG. 2B), for example. The method 400c can also generate a synchronization string and commence sending the synchronization string 454 toward the RF transmitter 154 (FIG. 1). Depending on the embodiment, the synchronization string can be sent continuously until synchronization is achieved or, it can be sent as a burst, and resent as necessary.

Next, the method 400c checks to see if the current operating mode is still the synchronize mode 456. If the current operating mode is still the synchronize mode 456, then the method 400c returns to step 456 and waits until the current operating mode changes. If the current operating mode is not the synchronize mode 456, then the method 400c ceases 458 sending the synchronous string and returns to step 452.

Returning to step 452, if the current operating mode is the run mode, then method 400c proceeds to step 460. At step 460, the method 400c, based at least on the adaptive-protection table, can forward the highest modulation and FEC requirements for the high level QoS communication data to the Line encoder and FEC 255 (FIG. 2A). Next, the method 400c can fetch Nh bytes from the FIFO high 230a (FIG. 2A) and forward 462 them to Line encoder and FEC 255 (FIG. 2A), where Nh represents the number of bytes in a frame subject to a high level QoS. In some embodiments, the modulation and FEC information can be sent in-band to the Line encoder and FEC 255 (FIG. 2A) via the adaptive-protection header. In yet other embodiments, the method 400c can skip step 460 and fetch 462 Nf bytes from the FIFO high 2300a (FIG. 2B) and forward 462 them to output interface 2550 (FIG. 2B), where Nf represents the fixed number of bytes in a frame to be processed.

Similarly, the method 400c can forward 464 the modulation and FEC requirements for the medium QoS communication data toward the Line encoder and FEC 255 (FIG. 2A). The method 400c can then fetch Nm bytes from the FIFO med 230b (FIG. 2A) and forward them 466 toward the Line encoder and FEC 255 (FIG. 2A), where Nm represents the number of bytes in a frame subject to medium level QoS. In some embodiments, the modulation and FEC information can be sent in-band to the Line encoder and FEC 255 (FIG. 2A) via the adaptive-protection header. In yet other embodiments, the method 400c can skip step 464 and fetch 466 Nf bytes from the FIFO med 2300b (FIG. 2B) and forward 466 them to output interface 2550 (FIG. 2B).

Similarly again, the method 400c can forward 468 the modulation and FEC requirements for the low QoS communication data toward the Line encoder and FEC 255 (FIG. 2A). The method can then fetch Nl bytes from the FIFO low 230c (FIG. 2A) and forward them 470 to the Line encoder and FEC 255 (FIG. 2A). In other embodiments, the modulation and FEC information can be sent in-band to the Line encoder and FEC 255 (FIG. 2A) via the adaptive-protection header. In yet other embodiments, the method 400c can skip step 468 and fetch 470 Nf bytes from the FIFO low 2300c (FIG. 2B) and forward 470 them to output interface 2550 (FIG. 2B). Next, the method 400c can return to step 452 to again verify the current mode of operation.

Figure 5A:
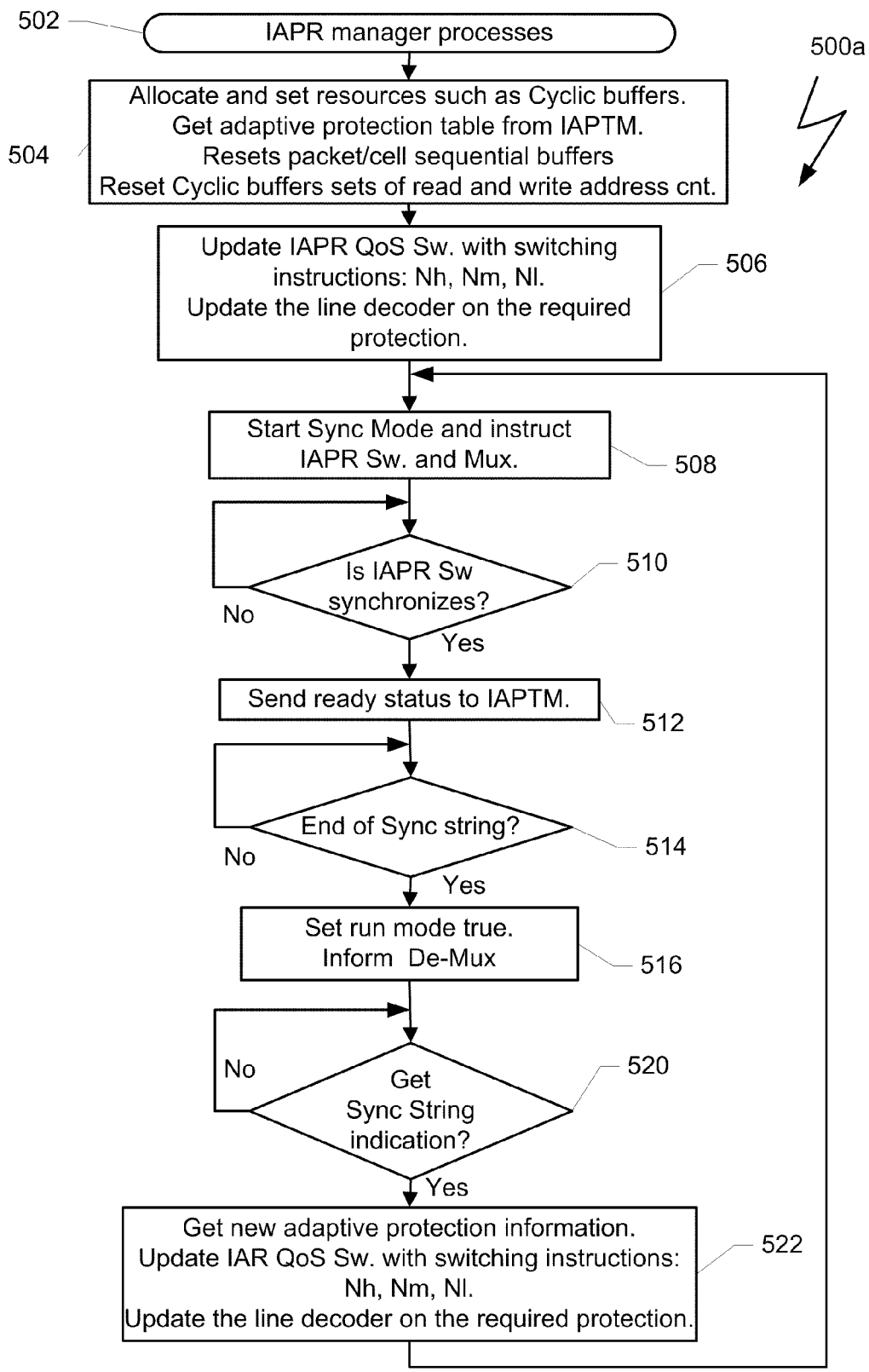
FIG. 5A schematically illustrates a flowchart showing relevant processes of an exemplary method of an IAPR manager, according to exemplary techniques of the present disclosure.

FIG. 5A schematically illustrates a flowchart showing relevant processes of an exemplary method of an IAPR manager, according to exemplary techniques of the present disclosure.

The illustrated flowchart shows relevant processes of an exemplary method 500a. The method 500a can be executed 502 by the IAPR manager 390 and/or 3900 (FIG. 3A or 3B), for example, or other components or combinations thereof.

An exemplary method 500a may be initiated 504 by the IAPTR upon power on or reset, for example. During initiation, 504 the IAPTM can be introduced to the unit/components of IAPR 300 or 3000 (FIG. 3A or FIG. 3B) and to the IAPT Manager 290 or 2900 (FIG. 2A or FIG. 2B) via link 114. A connection with Receiving Node 102 (FIG. 1) through the communication link 130 and a connection with the RF receiver 156 (FIG. 1) through the communication link 158 can also be established. Relevant resources can be allocated and reset and/or set as necessary. For example, the allocated and reset/set resources may include, but are not limited to: FIFOs 3500 (FIG. 3B), re-setting the sequential buffers 350 (FIG. 3A), adaptive-protection header tables, and so on.

At step 506, the IAPR switch 330 (FIG. 3A) can be updated with the number of bytes that are expected in each block that is received over each path (i.e., receive the values for Nh, Nm, and Nl, in the illustrated example). In some embodiments, the method 500a can update 506 the IAPR switch 3300 (FIG. 3B) with the number of bytes, Nf, in each block received from each path. The method 500a can update the FEC decoders 3530 (FIG. 3B) on the required FEC protection for each path, and so on.

The method 500a can start or enter a synchronize mode and instruct 508 the IAPR switch 330 or 3300 (FIG. 3A or FIG. 3B) and the sequence identifier and Mux 360 or 3600 (FIG. 3A or 3B) accordingly. Next, the method 500a determines whether or not 510 the IAPR switch 300 or 3000 (FIG. 3A or FIG. 3B) is synchronized with the IAPT 200 or 2000 (FIG. 2A or FIG. 2B). If the IAPR switch is not synchronized with the IAPT switch 510, then the method 500a returns to step 510 where it awaits synchronization. If on the other hand, the IAPR switch is synchronized with the IAPT switch 510, then the method 500a proceeds to step 512 where a ready status can be sent to the IAPT 200 or 2000 (FIG. 2A or FIG. 2B).

The method 500a then checks to determine whether or not an end of a synchronization string has been reached 514, indicating that the IAPT is ready to enter into the run mode. If the end of the synchronization string has not been reached, then the method 500a returns to step 514. If however, the end of the synchronization string has not been reached 514, then the method 500a can set 516 the IAPR 300 or 3000 (FIG. 3A or 3B) into run mode and can set 516 the relevant components of the IAPR to the run mode. The components set by the method 500a can include, but are not limited to: the sequence identifiers and Mux 360 or 3600 (FIG. 3A or FIG. 3B), etc.

During the run mode, the method 500a can check 520 whether a new synchronize mode has been initiated by the IAPT 142 (FIG. 1). This is performed by the method 500a periodically or a periodically checking to see whether or not a synchronize mode indication has been received 520. If a synchronize mode indication has not been received, then the method 500a returns to step 520 and continues to loop around this check function. If, however, a synchronize mode indication has been received 520, then the method 500a proceeds to step 522.

At step 522, the method 500a can fetch new adaptive protection information. In addition, the method 500a may update 522 the IAPR switch 330 or 3300 (FIG. 3A or FIG. 3B) with the required switching information. The updated switching information may include as, but is not limited to: the number of bytes to route on each path, the FEC decoding information, etc. Finally, the method 500a returns to step 508 and starts another synchronize mode cycle.

In embodiments in which the BER protection is not dependent on the current SNR, the method 500a can terminate after step 516.

Figure 5B:
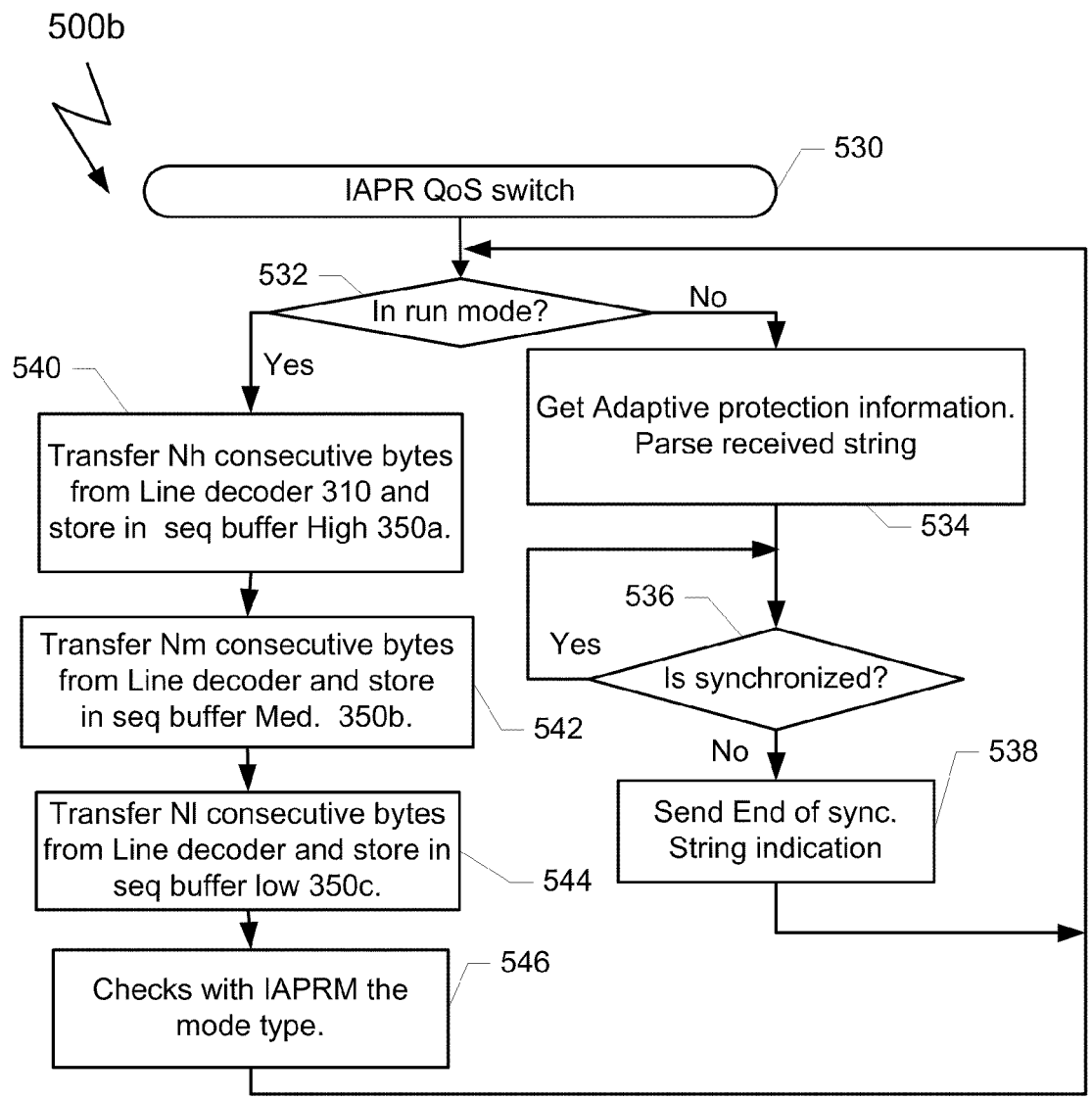
FIG. 5B schematically illustrates a flowchart showing relevant processes of an exemplary method of an IAPR QoS switch, according to exemplary techniques of the present disclosure.

FIG. 5B schematically illustrates a flowchart showing relevant processes of an exemplary method of an IAPR QoS switch, according to exemplary techniques of the present disclosure. In the illustrated flowchart, relevant processes of an exemplary method 500b are shown. The method 500b can be executed 530 by the IAPR switch 330 and/or 3300 (FIG. 3A or FIG. 3B), for example, or other components or combinations of components.

The method 500b can begin in checking 532 the current mode of operation (i.e., run or sync). If the method 500b determines that the current mode of operation is the synchronize mode 532, then the method 500b can fetch 534 updated adaptive-protection information from the IAPT manager 390 or 3900 (FIG. 3A or FIG. 3B), etc. The adaptive-protection information may include, but is not limited to, the number of bytes in each block (Nh, Nm, & Nl, for example). The method 500b may also parse 534 the received synchronization string to verify that the IAPR 140 and IAPT 142 (FIG. 1) are synchronized. Next, the method 500b determines whether or not the IAPR and the IAPT are synchronized 536. If the IAPR and the IAPT are not synchronized, then the method 500b returns to step 536 where it awaits the detection of synchronization. If however, the IAPR and the IAPT are synchronized 536, then the method 500b sends 538 an end of synchronize string indication and returns to step 532.

Returning to step 532, if the current operating mode is the run mode, then method 500b proceeds to step 540. At step 540, the method 500b can transfer Nh bytes received from line decoder 310 (FIG. 3A) toward the sequence buffer associated with the High QoS path 350a. Once an entry in the sequence buffer is filled, the write indication can be changed to a read indication. Next, the method 500b can transfer 542 Nm bytes received from line decoder 310 (FIG. 3A) toward sequence buffer associated with the Medium QoS path 350b. Next, the method 500b can transfer 544 Nl bytes received from line decoder 310 (FIG. 3A) toward sequence buffer associated with the low QoS path 350a. It should be appreciated that although the illustrated embodiment processes the buffers sequential in order from the high level QoS path to the low level QoS path, that other embodiments may process the buffers in different orders and some embodiments may process two or more buffers in parallel.

In other embodiments, the number of bytes in steps 540, 542, and 544 can be of the same size (Nf). In such embodiments, Nf bytes can be received from the IARP input interface 3100 (FIG. 3B) and sent toward the FIFOs 3500a-c (FIG. 3B).

The method 500b may then check 546 with the IAPRM 390 (FIG. 3A), to determine if there has been a change in the mode of operation and return to step 532. If the current mode of operation is the run mode 532, then the method continues to step 540. If however, the current mode of operation has changed to the synchronize mode 532, then the method 500b continues to step 534. In other embodiments in which the BER protection is fix, after step 544 the method 500b can return to step 540.

Figure 5C:
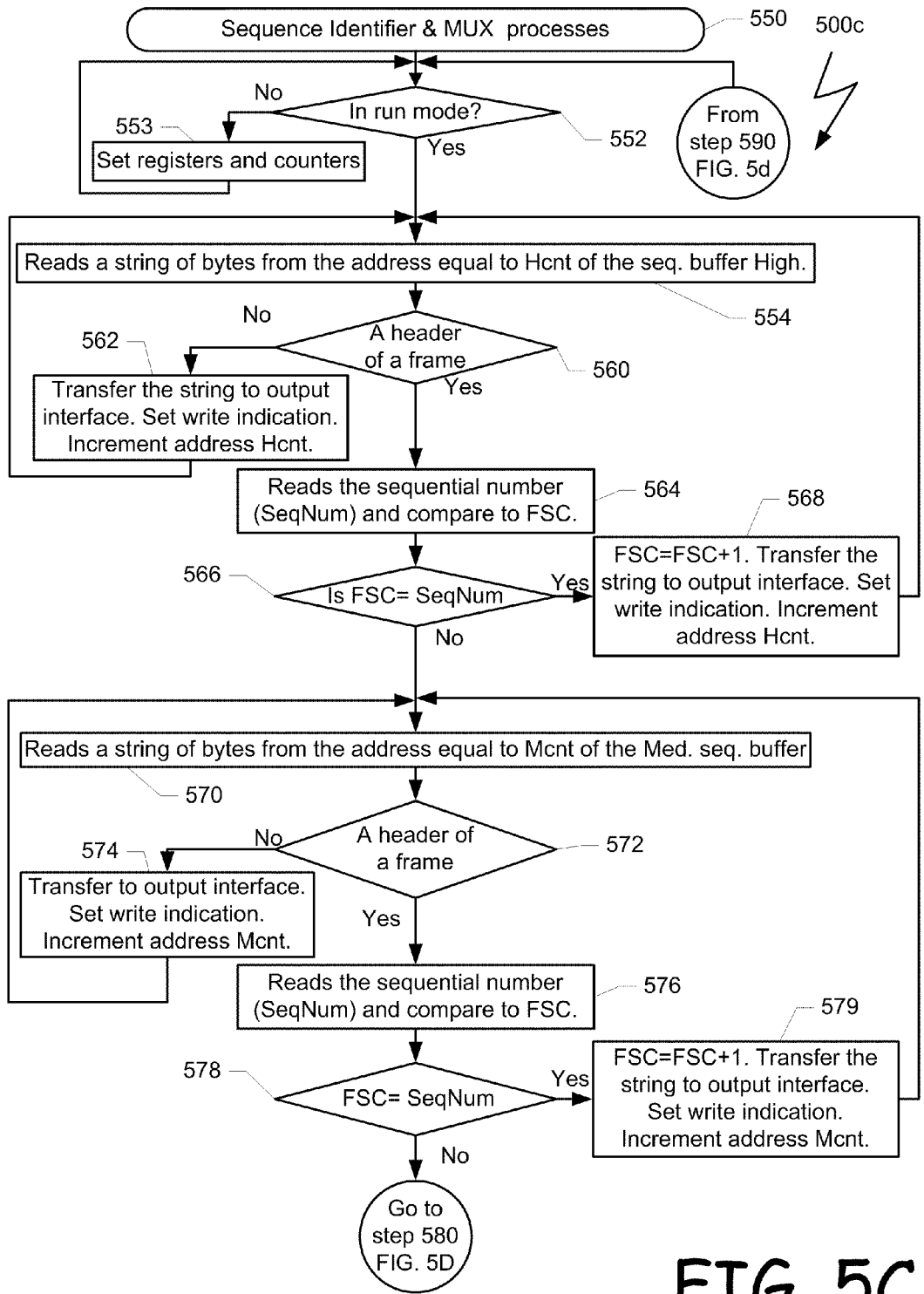
FIG. 5C and FIG. 5D schematically illustrate a flowchart showing relevant processes of an exemplary method of a sequence identifier and de-Mux, according to exemplary techniques of the present disclosure.
Figure 5D:
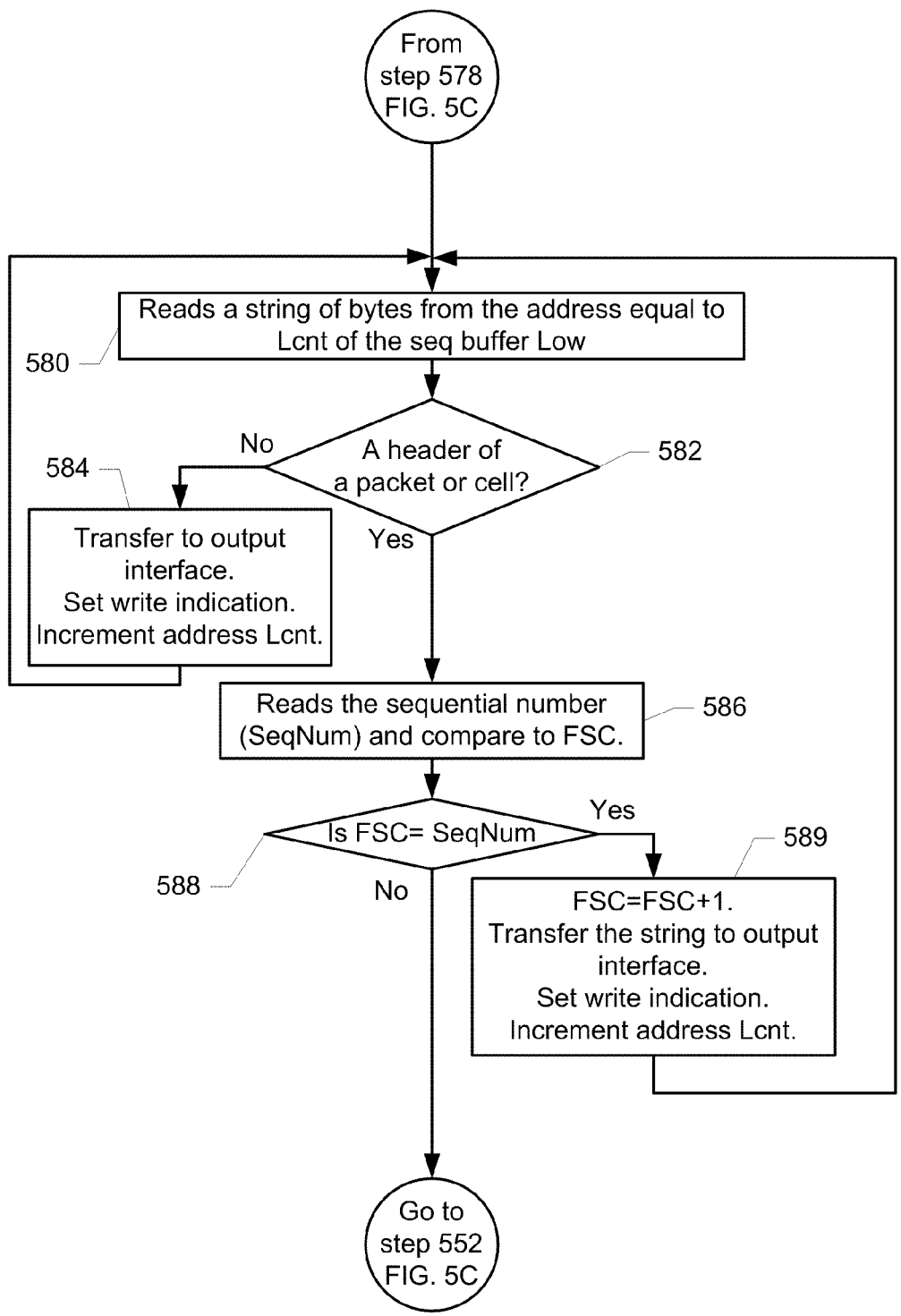

FIG. 5C and FIG. 5D schematically illustrate a flowchart showing relevant processes of an exemplary method of a sequence identifier and Mux, according to exemplary techniques of the present disclosure. The illustrated flowchart shows relevant processes of an exemplary method 500c. The method 500c can be executed 550 by the sequence identifier and Mux (SIM) 360 or 3600 (FIG. 3A or FIG. 3B), for example, as well as other components or combinations of other components. Upon initiation, the method 500c can check the current mode of operation 552 (i.e., run or synchronize mode). If the method 500c determines that the current mode of operation is the synchronize mode 552, then the method 500c sets 553 the read counters for the three sequence buffers (Hcnt, Mcnt and Lcnt) to an initial value and, in addition a frame sequence counter (FSC) is set to be equal to the SeqNum that will be used by the IAPT 142 (FIG. 1) in the starting of the next run mode. Then method 500c returns to step 552 to continue monitoring the current mode of operation. If however, the current mode of operation is the run mode 552, then the method 500c proceeds to step 554. At step 554, the method 500c reads a string of bytes fetched from the sequence buffer associated with the high level QoS path 350a or 3560a (FIG. 3A or FIG. 3B) from the address that that is equal to Hcnt. Next, the method 500c then determines whether or not the string of fetched bytes is a header of a frame. If the string of bytes is not a header, then the string of bytes is sent toward the output interface 370 or the IARP output interface 3700 (FIG. 3Aa or FIG. 3B). The read/write indication is set 562 to write. A counter for the high QoS sessions (Hcnt) is incremented 562 by one, and the method 500c returns to step 554.

If however, the string of fetched bytes is a header of a frame 560, the method 500c reads the sequence number (SeqNum) in the header 564 and compares it to the value of the frame sequence counter (FSC) 566. If the received SeqNum is equal to the FSC 566, then the method 500c increase the value of the FSC by one 568, and transfers the string of bytes to the output interface 370 or the IARP output interface 3700. Further, the read/write indication in the appropriate entry of the sequence buffer is set to write status, and the address counter, Hcnt, is incremented by one 568. The method 500c then returns to step 554.

If the value of the FSC does not equal the received SeqNum 566, then the method 500c reads 570 a string of bytes from the sequence buffer associated with the medium level QoS path 350b or 3560b. The method 500c then determines whether the string of bytes is a header of a frame 572. If the string of bytes is not a header, then the communication data is sent toward the output interface 370 or the IARP output interface 3700 (FIG. 3A or FIG. 3B), the read/write indication is set to write, and the address counter for the Med QoS sessions (Mcnt) is incremented by one 572. The method 500c then returns to step 570.

If however, the string of bytes is a header of a frame 572, the method 500c reads the sequence number (SeqNum) in the header and compares 576 it to the value of FSC. If the value of FSC equals the received SeqNum 578, then the method 500c increases 579 the value of FSC by one, transfers 579 the data to output interface 370 or IARP output interface 3700, sets 579 the read/write indication in the appropriate entry of the sequence buffer to write, and increments 579 the address in the Mcnt counter. Next, the method 500c returns to step 570. If however, 578 the address of the sequence buffer FSC does not equal the received SeqNum, then the method 500c proceeds to step 580 in FIG. 5D.

At step 580 as illustrated in FIG. 5D, the method 500c reads 581 a string of bytes from sequence buffer associated with the Low level QoS path 350c or 3560c. The method then determines 582 whether or not the string of bytes is a header of a frame. If the string of bytes is not a header 582, then the string of bytes is sent 584 toward the output interface 370 or the IARP output interface 3700 (FIG. 3A or FIG. 3B) and the read/write indication is set 584 to write. Next, a counter for the Low QoS sessions (Lcnt) is incremented 584 by one, and the method 500c returns to step 581.

If however, the string of bytes is a header of a frame, then the method 500c reads 586 the sequence number (SeqNum)

in the header of the communication data and compares 586 the SeqNum to the value of the FSC. If the value of the FSC equals the received SeqNum 588, then the method 500c increase 589 the FSC by one, transfers 589 the data to output interface 370 or the IARP output interface 3700, sets 589 the read/write indication in the appropriate entry of the sequence buffer to write, and increments 589 the address in the Lcnt counter. Next, the method 500c returns to step 580. If however, the value of the FSC does not equal the received SeqNum, then the method 500c returns to step 552 (FIG. 5C).

In the description and claims of the present disclosure, each of the verbs, "comprise", "include" and "have", and conjugates thereof, are used to indicate that the object or objects of the verb are not necessarily a complete listing of members, components, elements, or parts of the subject or subjects of the verb.

In this disclosure anything designated as a unit or module or component are interchangeable and may be a stand-alone unit or a specialized module. It may be modular or have modular aspects allowing it to be easily removed and replaced with another similar unit or module. Each unit or module or component may be any one of, or any combination of, software, hardware, and/or firmware. Software of a logical module can be embodied on a computer readable medium such as a read/write hard disc, CDROM, Flash memory, ROM, etc. In order to execute a certain task a software program can be loaded to an appropriate processor as needed.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Many other ramification and variations are possible within the teaching of the embodiments comprising different combinations of features noted in the described embodiments.

It will be appreciated by persons skilled in the art that the present invention is not limited by what has been particularly shown and described herein above. Rather the scope of the invention is defined by the claims that follow.

What is claimed is:

1. A system for employing different bit-error-rate (BER) protection techniques for a plurality of communication sessions carried simultaneously over a communication link based on a quality of service level required by each particular individual session, the system comprising:
an intermediate-adaptive-protection transmitter that is associated with a transmitting node at one side of the communication link and comprising a plurality of paths and each path is associated with a BER protection technique, the intermediate-adaptive-protection transmitter being configured to intercept a stream of a plurality of frames, with each of the plurality of frames being associated with one of the plurality of communication sessions, associate a BER protection technique for each frame of the plurality of frames according to a quality of service (QoS) level required by each frame, and transmit the frames subjected to the associated BER protection technique toward the other side of the communication link;
an intermediate-adaptive-protection receiver associated with a receiving node on the other side of the communication link, the intermediate-adaptive-protection transmitter being configured to transmit the frames subject to the associated BER protection technique by being further configured to:
convert the received plurality of frames into a stream of adapted-bit-error-rate segments by performing the associated BER protection technique on each frame; and transfer a stream of adapted-bit-error-rate segments toward the intermediate-adaptive-protection receiver;
the intermediate-adaptive-protection receiver being configured to receive the adapted-bit-error-rate segments, process the adapted-bit-error-rate segments to restore the stream of the intercepted plurality of frames of the plurality of communication sessions, and transfer the restored stream of plurality of frames toward the receiving node; and
wherein the number of bytes of the stream of adapted-bit-error-rate segments that is transferred toward the intermediate-adaptive-protection receiver is divided equally between the paths.

2. The system of claim 1, wherein the intermediate-adaptive-protection receiver, further comprises:
an IAPR switch that routes each received adapted-bit-error-rate segment to one of the plurality of paths according to the BER protection that was performed on the received segment; and
a sequence identifier and multiplexer (SIM) that multiplexes the output of each path into the restored stream of frames.

3. The system of claim 2, wherein the restored single stream of a plurality of frames of the plurality of different communication sessions is based on a sequence number allocated to each frame that was intercepted by the intermediate-adaptive-protection transmitter.

4. The system of claim 2, wherein the intermediate-adaptive-protection receiver, further comprises: a line decoder that is installed between the communication link and the IAPR switch and is configured to decode the data communication received from the communication link and delivers the stream of adapted-bit-error-rate segments toward the IAPR switch.

5. A system for employing different bit-error-rate (BER) protection techniques for a plurality of communication sessions carried simultaneously over a communication link based on a quality of service level required by each particular individual session, the system comprising:
an intermediate-adaptive-protection transmitter that is associated with a transmitting node at one side of the communication link, the intermediate-adaptive-protection transmitter being configured to intercept a stream of a plurality of frames, with each of the plurality of frames being associated with one of the plurality of communication sessions, associate a BER protection technique for each frame of the plurality of frames according to a quality of service (QoS) level required by each frame, and transmit the frames subjected to the associated BER protection technique toward the other side of the communication link;
an intermediate-adaptive-protection receiver associated with a receiving node on the other side of the communication link, the intermediate-adaptive-protection transmitter being configured to transmit the frames subject to the associated BER protection technique by being further configured to:
convert the received plurality of frames into a stream of adapted-bit-error-rate segments by performing the associated BER protection technique on each frame;

and transfer a stream of adapted-bit-error-rate segments toward the intermediate-adaptive-protection receiver;

the intermediate-adaptive-protection receiver being configured to receive the adapted-bit-error-rate segments, process the adapted-bit-error-rate segments to restore the stream of the intercepted plurality of frames of the plurality of communication sessions, and transfer the restored stream of plurality of frames toward the receiving node; and the intermediate-adaptive-protection transmitter being configured to add a sequence number to each intercepted frame.

6. The system of claim 5, wherein the intermediate-adaptive-protection receiver is embedded within the receiver node.

7. The system of claim 5, wherein the intermediate-adaptive-protection receiver further comprises an embedded radio frequency receiver.

8. The system of claim 5, wherein the intermediate-adaptive-protection transmitter comprises a plurality of paths and each path is associated with a BER protection technique.

9. The system of claim 8, wherein the intermediate-adaptive-protection transmitter further comprises:

aQoS switch that routes each intercepted frame to one of the plurality of paths based at least in part on a QoS level that is associated with the frame; and a synchronizer and multiplexer that multiplexes the adapted-bit-error-rate segments from each path into a stream of segments.

10. The system of claim 9, wherein the intermediate-adaptive-protection transmitter further comprises:

a line encoder that receives the stream of segments from the synchronizer and multiplexer and for each received segment, the line encoder is configured to:

perform at least one BER technique selected from a group consisting of forward-error-correction (FEC) and modulation according to the BER protection that is associated with the path from where the segment was received to create the stream of adapted-bit-error-rate segments; and transfer the stream of adapted-bit-error-rate segments toward the intermediate-adaptive-protection receiver.

11. The system of claim 10, wherein each path further comprises a FIFO to operate as a buffer between the QoS switch and the synchronizer and multiplexer.

12. The system of claim 9, wherein each path further comprises:

a. an FEC encoder configured to perform forward-error-correction according to the BER protection that is associated with the path; and b. a FIFO to operate as a buffer between the FEC encoder and the synchronizer and multiplexer.

13. The system of claim 5, wherein the intermediate-adaptive-protection transmitter is embedded within the transmitting node.

14. The system of claim 5, wherein the intermediate-adaptive-protection transmitter further comprises an embedded radio frequency transmitter.

15. The system of claim 5, further comprise a signal-to-noise-ratio indicator for noise measurements.

16. The system of claim 5, wherein the communication link is based on the ATM protocol and a frame is an ATM cell, and the level of QoS required by each frame is embedded in a header of the ATM cell.

17. The system of claim 5, wherein the communication link is a microwave transmission and the BER protection is based at least 18. A method for selecting a bit-error-rate protection technique from a plurality of techniques and applying the selected technique for a communication session selected from a plurality of communication sessions carried simultaneously over a communication link between a first node and a second node, the method comprising the acts of:

the first node intercepting a stream of a plurality of frames, each of the plurality of frames in the stream being associated with one of the plurality of different communication sessions and associating a sequence number with each frame;

selecting a BER protection technique for each frame of the plurality of frames based at least in part on a quality of service (QoS) level required by each frame;

applying the selected BER protection technique respectively to each frame by converting the intercepted stream of the plurality of frames into a stream of adapted-BER segments by executing the selected BER protection method and transferring the stream of adapted-BER segments toward the second node over the communication link; and the first node transmitting toward the second node, the plurality of frames that have been subjected to the selected BER protection technique.

19. The method of claim 18, wherein restoring the similar stream is based at least in part on the sequence number.

20. The method of claim 18, wherein the number of bytes of the stream of the adapted-BER segments that is transferred toward the second node is divided equally between the paths.

21. The method of claim 18, further comprising:

a receiver on the opposing end of the communications link from the first node, receiving the stream of adapted-BER segments;

processing the received adapted-BER segments to restore the intercepted stream of the plurality of frames; and transferring the restored stream toward the second node.

22. The method of claim 21, further comprising the act of routing each frame over a path selected from a plurality of paths based at least in part on the QoS level required by the frame, and each of the plurality of available BER protection technique is performed on one of the plurality of paths.

23. The method of claim 22, wherein the act of converting the intercepted stream of the plurality of frames further comprises:

a. multiplexing the adapted-BER segments from each path into a stream of segments; and b. FEC encoding each segment according to the BER protection that is performed on the path from where the segment was multiplexed to create the stream of adapted-BER segments.

24. The method of claim 18, wherein the step selecting a BER protection further comprises selecting a modulation type.

25. The method of claim 18, wherein the communication link is based on the ATM protocol and a frame is an ATM cell, and the level of QoS is embedded in a header of the ATM cell.

26. A system for employing different bit-error-rate (BER) protection techniques for a plurality of communication sessions carried simultaneously over a communication link based on a quality of service level required by each particular individual session, the system comprising:

an intermediate-adaptive-protection transmitter that is associated with a transmitting node at one side of the communication link, the intermediate-adaptive-protection transmitter being configured to:

intercept a stream of a plurality of frames, with each of the plurality of frames being associated with one of the plurality of communication sessions, associate a BER protection technique for each frame of the plurality of frames according to a quality of service (QoS) level required by each frame, and transmit the frames subjected to the associated BER protection technique toward the other side of the communication link; and the intermediate-adaptive-protection transmitter is further configured to add a sequence number to each intercepted frame.

* * * * *